United States Patent
Kim et al.

(10) Patent No.: US 9,305,489 B2
(45) Date of Patent: Apr. 5, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Hak Sun Kim, Seoul (KR); Min Woo Kim, Hwaseong-si (KR); Gee-Bum Kim, Suwon-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/269,024

(22) Filed: May 2, 2014

(65) Prior Publication Data

US 2015/0123952 A1    May 7, 2015

(30) Foreign Application Priority Data

Nov. 4, 2013   (KR) .................. 10-2013-0132961

(51) Int. Cl.
*G09G 3/32* (2006.01)
*H01L 51/52* (2006.01)
*H01L 27/32* (2006.01)

(52) U.S. Cl.
CPC ............ *G09G 3/3225* (2013.01); *G09G 3/3233* (2013.01); *G09G 3/3258* (2013.01); *H01L 27/3246* (2013.01); *H01L 51/5218* (2013.01); *H01L 51/5271* (2013.01); *G09G 2330/021* (2013.01); *H01L 27/3216* (2013.01); *H01L 27/3218* (2013.01); *H01L 51/5225* (2013.01); *H01L 51/5284* (2013.01); *H01L 2251/533* (2013.01)

(58) Field of Classification Search
CPC .............. G09G 3/3208; G09G 3/3225; G09G 2330/021; G09G 3/3233; G09G 3/3258; H01L 225/50; H01L 225/5315; H01L 2227/32
See application file for complete search history.

(56) References Cited

U.S. PATENT DOCUMENTS

| | | | |
|---|---|---|---|
| 2011/0148944 A1* | 6/2011 | Kobayashi | 345/690 |
| 2012/0080694 A1* | 4/2012 | Yoshida et al. | 257/89 |
| 2012/0146487 A1* | 6/2012 | Kim | 313/504 |
| 2014/0077725 A1* | 3/2014 | Lee et al. | 315/312 |
| 2014/0183480 A1* | 7/2014 | Lee et al. | 257/40 |
| 2014/0203245 A1* | 7/2014 | Gupta et al. | 257/40 |

(Continued)

FOREIGN PATENT DOCUMENTS

| JP | 2000-182764 A | 6/2000 |
|---|---|---|
| JP | 4797921 B2 | 8/2011 |

(Continued)

OTHER PUBLICATIONS

English Abstract, Application No. 1020120097509, dated Sep. 4, 2012, for corresponding Korean Application No. 10-2014-0030842 A listed above, 1 page.

*Primary Examiner* — Fred Tzeng
(74) *Attorney, Agent, or Firm* — Lewis Roca Rothgerber Christie LLP

(57) ABSTRACT

An OLED display includes a plurality of pixels, and a pixel includes a light emitting portion including an emission layer configured to generate light, a pixel electrode, and an opposing electrode facing each other. The light emitting portion is between the pixel electrode and the opposing electrode. Each pixel also includes a light outputting portion at a side of the fight emitting portion and configured to allow light to pass therethrough.

20 Claims, 36 Drawing Sheets

(56) References Cited

U.S. PATENT DOCUMENTS

| | | | |
|---|---|---|---|
| 2014/0295597 A1* | 10/2014 | Sato et al. | 438/29 |
| 2014/0346457 A1* | 11/2014 | Oh et al. | 257/40 |
| 2014/0353630 A1* | 12/2014 | Baek et al. | 257/40 |
| 2015/0001474 A1* | 1/2015 | Park | 257/40 |
| 2015/0028299 A1* | 1/2015 | Jung et al. | 257/40 |
| 2015/0029710 A1* | 1/2015 | Kim et al. | 362/217.15 |
| 2015/0041766 A1* | 2/2015 | Naijo | 257/40 |
| 2015/0102298 A1* | 4/2015 | Namkung et al. | 257/40 |

FOREIGN PATENT DOCUMENTS

| | | |
|---|---|---|
| KR | 10-0579175 B1 | 5/2006 |
| KR | 10-1029299 B1 | 4/2011 |
| KR | 10-1068395 B1 | 9/2011 |
| KR | 10-2014-0030842 A | 3/2014 |

* cited by examiner

ORGANIC LIGHT EMITTING DIODE DISPLAY

CROSS-REFERENCE TO RELATED APPLICATION

This application claims priority to and the benefit of Korean Patent Application No. 10-2013-0132961, filed in the Korean Intellectual Property Office on Nov. 4, 2013, the entire content of which is incorporated herein by reference.

BACKGROUND

1. Field

Aspects of embodiments of the present invention are directed toward an organic light emitting diode (OLED) display.

2. Description of the Related Art

Among the display devices, the organic light emitting diode (OLED) display is a self-light-emitting display; that is, it does not require a separate light source. Therefore, it has lower power consumption than non-self-light-emitting displays, and response speed, viewing angle, and contrast ratio of the organic light emitting diode (OLED) display are excellent.

The organic light emitting diode (OLED) display includes a plurality of pixels such as red color pixels, blue color pixels, green color pixels, and white pixels (white color pixels), and may express a full range of colors by combining the different color pixels. Each pixel includes a light emitting element and a plurality of thin film transistors for driving the light emitting element.

The light emitting element of the organic light emitting diode (OLED) display includes a pixel electrode, a common electrode, and an emission layer between the two electrodes. Either the pixel electrode or the common electrode is an anode, and the other of the pixel electrode or the common electrode is a cathode. Electrons injected from the cathode and holes injected from the anode are coupled with each other (that is, joined) in the light emitting layer to form excitons, and the excitons emit light while discharging energy. The common electrode is formed throughout a plurality of pixels to transfer a common voltage.

The OLED display may be a bottom emission display, in which light is emitted toward a bottom thereof, or a top emission display, in which light is emitted toward a top thereof. In the top emission OLED display, the common electrode may include a transparent conductive material, and in the bottom emission OLED display, the common electrode may include opaque conductive material.

External light entering from the outside of the OLED display may be reflected by the surface of the OLED display or by various internal layers of the OLED display, thereby reducing visibility and quality of an image. For example, when the external light is reflected, visibility of black color is decreased, thereby causing a decrease in a contrast ratio. Therefore, a polarizer may be attached at a peripheral area of an interface (or boundary) where the OLED display meets an external environment so as to reduce reflection of the external light.

In addition, because the OLED display has a multi-layered structure, light generated from the emission layer may be kept in (that is, may remain in) an internal layer of the OLED display rather than being emitted outwards. For example, when the polarizer is attached to an external side of the OLED display, light generated in the emission layer may be absorbed or reflected by the polarizer, such that light extraction efficiency of the OLED display may be significantly reduced.

The above information disclosed in this Background section is only for enhancement of understanding of the background of the invention, and therefore, it may contain information that does not form the prior art that is already known in this country to a person of ordinary skill in the art.

SUMMARY

Aspects of embodiments of the present invention are directed toward improving light extraction efficiency of an OLED display and reducing power consumption thereof.

Also, according to aspects of embodiments of the present invention, a size of an opening in the pixel to emit light is reduced or minimized while light extraction efficiency of the OLED display is increased, so as to more simply realize or create a high-resolution OLED display, and accordingly, improve freedom in designing a pixel layout.

Further, according to aspects of embodiments of the present invention, reflectance of external light by the OLED display may be reduced.

An OLED display according to an example embodiment of the present invention includes a plurality of pixels, and a pixel includes a light emitting portion including an emission layer configured to generate light, and a pixel electrode and an opposing electrode facing each other, the light emitting portion being between the pixel electrode and the opposing electrode, and a light outputting portion at a side of the light emitting portion and configured to allow light to pass therethrough.

The pixel may further include a reflective portion facing the light outputting portion at another side of the light emitting portion opposite to the light outputting portion with the light emitting portion between the reflective portion and the light outputting portion.

At least one of the reflective portion, the pixel electrode, and the opposing electrode may be configured to reflect light toward the emission layer.

At least one of the reflective portion, the pixel electrode, and the opposing electrode may include a reflective conductive material.

The pixel of the OLED display may further include an insulating layer directly above or directly below the reflective portion.

The insulating layer may have a refractive index of less than or equal to about 1.4.

The reflective portion may be at a same layer as the pixel electrode and may include a same material as of the pixel electrode, and a thickness of the reflective portion may be greater than that of the pixel electrode.

A step difference between a top surface of the reflective portion and a top surface of the pixel electrode may be in a range of about 0.1 μm to about 1 μm.

The insulating layer may be between the reflective portion and the opposing electrode.

The reflective portion may be at a layer different from a layer at which the pixel electrode is located, and the insulating layer may be between the pixel electrode and the reflective portion.

A thickness of the reflective portion may be in a range of about 0.1 μm to about 1 μm.

The reflective portion may contact the opposing electrode.

The light outputting portion and the reflective portion may surround the light emitting portion.

The pixel may have a plurality of edge sides extending along a periphery of the respective pixel, and the light outputting portion may correspond to at least one of the edge sides, and the reflective portion correspond to the remaining edge sides.

A portion of the opposing electrode may be in the light outputting portion, and the portion of the opposing electrode in the light outputting portion may include an inclined portion inclined with respect to a direction in which another portion of the opposing electrode in the light emitting portion extends.

The pixel of the OLED display may further include a pixel defining layer between the pixel electrode and the opposing electrode, and the pixel defining layer may include a side wall facing the inclined portion and has an opening corresponding to the pixel electrode.

Each of the plurality of pixels may respectively include the light emitting portion, the light outputting portion, and the reflective portion, and the light outputting portion is located at a same side of each respective pixel.

The plurality of pixels may respectively include the light emitting portion, the light outputting portion, and the reflective portion, and the plurality of pixels may include at least two pixels and locations of light outputting portions with respect to the light emitting portions in the at least two pixels may be different from each other.

The plurality of pixels may be arranged substantially in a matrix form, and the locations of the light outputting portions with respect to the light emitting portions of the pixels arranged along a first direction may be alternately changed for every at least one pixel along the first direction The locations of the light outputting portions with respect to the light emitting portions of the pixels arranged along a second direction that is different from the first direction may be alternately changed for every at least one pixel.

According to aspects of example embodiments of the present invention, light extraction efficiency of an OLED display may be improved and power consumption thereof may be reduced. In addition, a high-resolution OLED display may be more simply realized or created by reducing or minimizing a size of an opening in each pixel to emit light while improving light extraction efficiency of the OLED display, and accordingly, freedom in designing a pixel layout may be improved. Further, reflectance of external light of the OLED display may be reduced.

DETAILED DESCRIPTION

Figure 1:
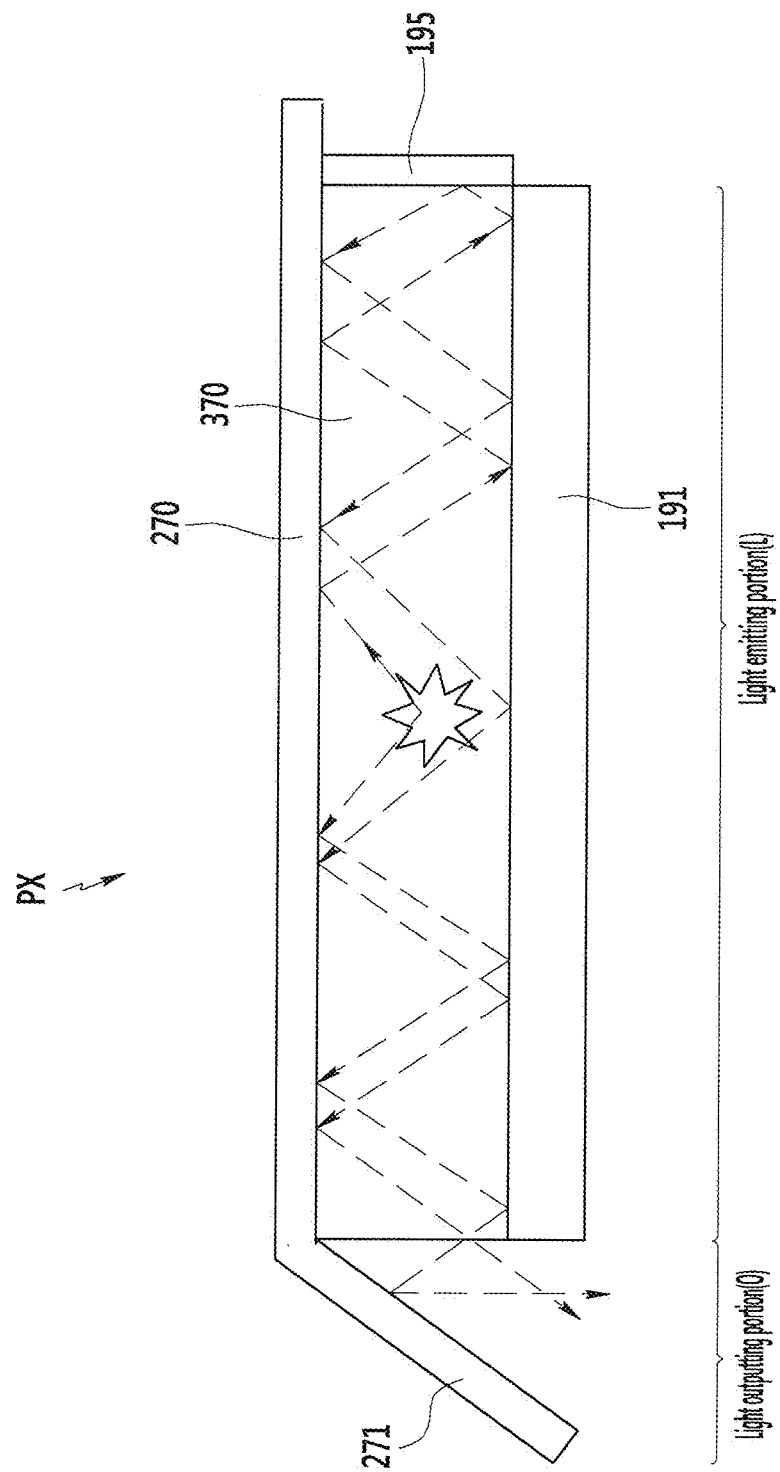
FIG. 1 is a schematic cross-sectional view of an OLED display illustrating a light extraction method of the OLED display according to an example embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thicknesses of layers, films, panels, regions, etc., may be exaggerated for clarity. Like reference numerals designate like elements throughout the specification. It will be understood that when an element (such as a layer, film, region, or substrate) is referred to as being "on" another element, it may be directly on the other element or one or more intervening elements may also be present. When an element is referred to as being "directly on" another element, there are no intervening elements present. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "comprising," "including," or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. Spatially relative terms, such as "on", "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", "beneath", or "under" other elements or features would then be oriented "above" or "over" the other elements or features. Thus, the example term "below" may encompass both an orientation of above and below. The device may be otherwise oriented (rotated 90 degrees or at other orientations), and the spatially relative descriptors used herein should be interpreted accordingly. Further, the use of "may" when describing embodiment of the present invention refers to "one or more embodiments of the present invention."

First, referring to FIG. 1, an organic light emitting diode (OLED) display according to an example embodiment of the present invention will be described. FIG. 1 is a schematic cross-sectional view of a light extraction method of an OLED display according to an example embodiment of the present invention.

Referring to FIG. 1, the OLED display according to the example embodiment of the present invention includes a plurality of pixels PX. Each pixel PX may display an image (e.g., may be configured to display an image) having a luminance according to an input image signal.

Each pixel PX includes a semiconductor element coupled to (e.g., connected to) a signal line and an organic light emitting element coupled to (e.g., connected to) the semiconductor. The semiconductor element may include at least one electric field effect transistor (FET).

The organic light emitting element is, for example, an organic light emitting diode and includes a pixel electrode 191 coupled to (e.g., connected to) the semiconductor element, an opposing electrode 270 receiving a common voltage, and an emission layer 370 provided between the pixel electrode 191 and the opposing electrode 270. The pixel electrode 191 may function as an anode, and the opposing electrode 270 may function as a cathode. Alternatively, the pixel electrode 191 may function as a cathode, and the opposing electrode 270 may function as an anode.

The organic light emitting element emits light having variable intensity according to an output current of the semiconductor element to display an image. The emission layer 370 of the organic light emitting element may include an organic material emitting light of one or more colors among a plurality of primary colors, such as three primary colors of red (R), green (G), and blue (B), four primary colors, and the like, or may include an organic material emitting white light (white color light). The organic light emitting device may display a desired image according to a spatial sum of the colors.

Referring to FIG. 1, each pixel PX includes a light emitting portion L, a light outputting portion O, and a reflective portion 195. The light outputting portion O is adjacent to the light emitting portion L.

The light emitting portion L includes an organic light emitting element including the pixel electrode 191, the opposing electrode 270, and the emission layer 370 provided between the pixel electrode 191 and the opposing electrode 270. The emission layer 370 generates light having a reference luminance (e.g., having a predetermined luminance). That is, a light emitting portion L of each pixel PX may generate light having a reference luminance (e.g., a predetermined luminance).

The light generated in the light emitting portion L is reflected between the pixel electrode 191 and the opposing electrode 270 and then moved to a side of the light emitting portion L. For this, the pixel electrode 191 and the opposing electrode 270 may include a reflective conductive material or a reflective material coated to an inner surface of the opposing electrode 270. The pixel electrode 191 and the opposing electrode 270 face each other and may form an optical waveguide in one pixel PX.

The light outputting portion O is separate from (e.g., separated from) the light emitting portion L and neighbors (e.g., is adjacent to) the light emitting portion L. The light outputting portion O is disposed adjacently at least one side of the light outputting portion O. For example, the light outputting portion O may be disposed adjacently at one side of the light emitting portion L. Light emitted in the light emitting portion L and then moved to a side thereof is outputted outwards from the organic light emitting element through the light outputting portion O. The IDLED display according to the example embodiment of FIG. 1 may be a bottom emission display, and thus, light is output in a downward direction relative to the pixel electrode 191 (that is, light is output in a direction from the opposite electrode 270 toward the pixel electrode 191).

In at least a portion of the light outputting portion O, for example, under the external side of the light outputting portion O, the pixel electrode 191 is not formed. That is, the pixel electrode 191 may be in a portion of the light outputting portion O, or the pixel electrode 191 may not be in a portion of the light outputting portion O.

The width of the light outputting portion O may be less than or equal to about 4 µm, but it is not limited thereto. A ratio of the area of the light outputting portion O with respect to the area of one pixel PX may be less than or equal to about 10%, but this is also not restrictive.

The opposing electrode 270 may extend to the light outputting portion O, and thus, may form an inclined portion 271. The inclined portion 271 of the opposing electrode 270 has a tilt angle (e.g., a predetermined tilt angle) and may be inclined downward (that is, the included portion 271 may be extend toward a bottom of the display or toward the pixel electrode 191). Light reaching the light outputting portion O may be reflected downward by the inclined portion 271 and then output.

The reflective portion 195 reflects light generated in the emission layer 370 of the light emitting portion L. The reflective portion 195 causes light transmitted from the light emitting portion L to move toward the light outputting portion O to control light to be output only through the at least one light outputting portion O with respect to one pixel PX, and for example, through a light outputting portion O disposed adjacently at a side of the light emitting portion L. The reflective portion 195 may include a reflective material, for example, a reflective metallic material.

The light outputting portion O and the reflective portion 195 face each other, interposing (e.g., are at opposite sides of) the light emitting portion L therebetween. That is, the at least one light outputting portion O is located adjacent to an edge of the light emitting portion L of each pixel PX, and the reflective portion 195 may be adjacent to an opposite edge of the light emitting portion L. That is, the light emitting portion L of each pixel PX may be surrounded (e.g., surrounded on two sides) by the light outputting portion O and the reflective portion 195.

Light is moved to a side of the light emitting portion L through the optical waveguide formed by the pixel electrode 191 and the opposing electrode 270 that face each other and is then output outwards through the light outputting portion O located adjacently at one side (e.g., only one side) of the light emitting portion L. Therefore, increased (or maximum) light extraction efficiency may be achieved through a limited or relatively small opening. Because light generated in the light emitting portion L is moved to one light outputting portion O through the optical waveguide and then outputted, light output efficiency may be improved and, at the same time, power consumption of the OLED display may be reduced.

The internal light is outputted only through the light outputting portion O, and therefore, absorption and reflection of external light are significantly reduced. An external light reflective layer for reducing reflection of the external light, such as a polarization plate used in a comparative or related display may not be necessary or desired. As described, the internal light moving toward the outside of the display is not absorbed by the polarization plate and the like, and therefore, light emission efficiency (that is, the efficiency of outputting the internal light generated in the emission layer 370) may be further improved.

When a single light outputting portion O is provided in each pixel PX, a size of an opening of the pixel PX may be reduced or minimized, and because the light emitting portion L and the light outputting portion O are separate, a high-resolution OLED display may be more easily realized and freedom in pixel design layout of the pixels PX may be increased.

Then, the OLED display according to the example embodiment of the present invention will be described in detail with reference to FIG. 1 and FIG. 2.

Figure 2:
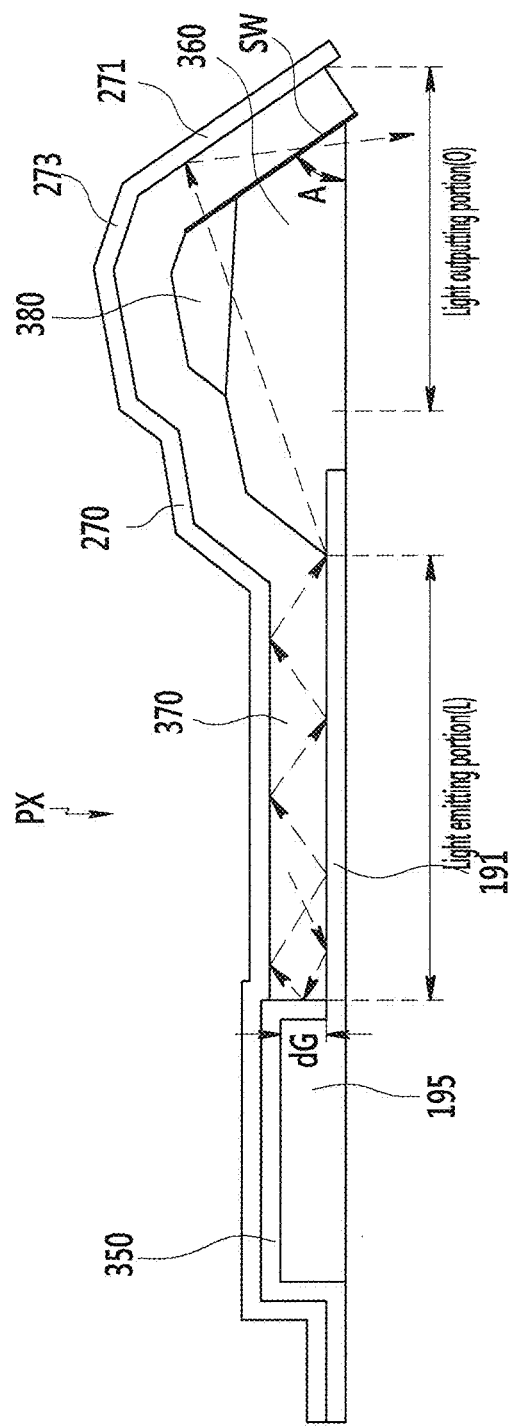
FIG. 2 and FIG. 3 are cross-sectional views of the OLED display according to the example embodiment of the present invention.
Figure 3:
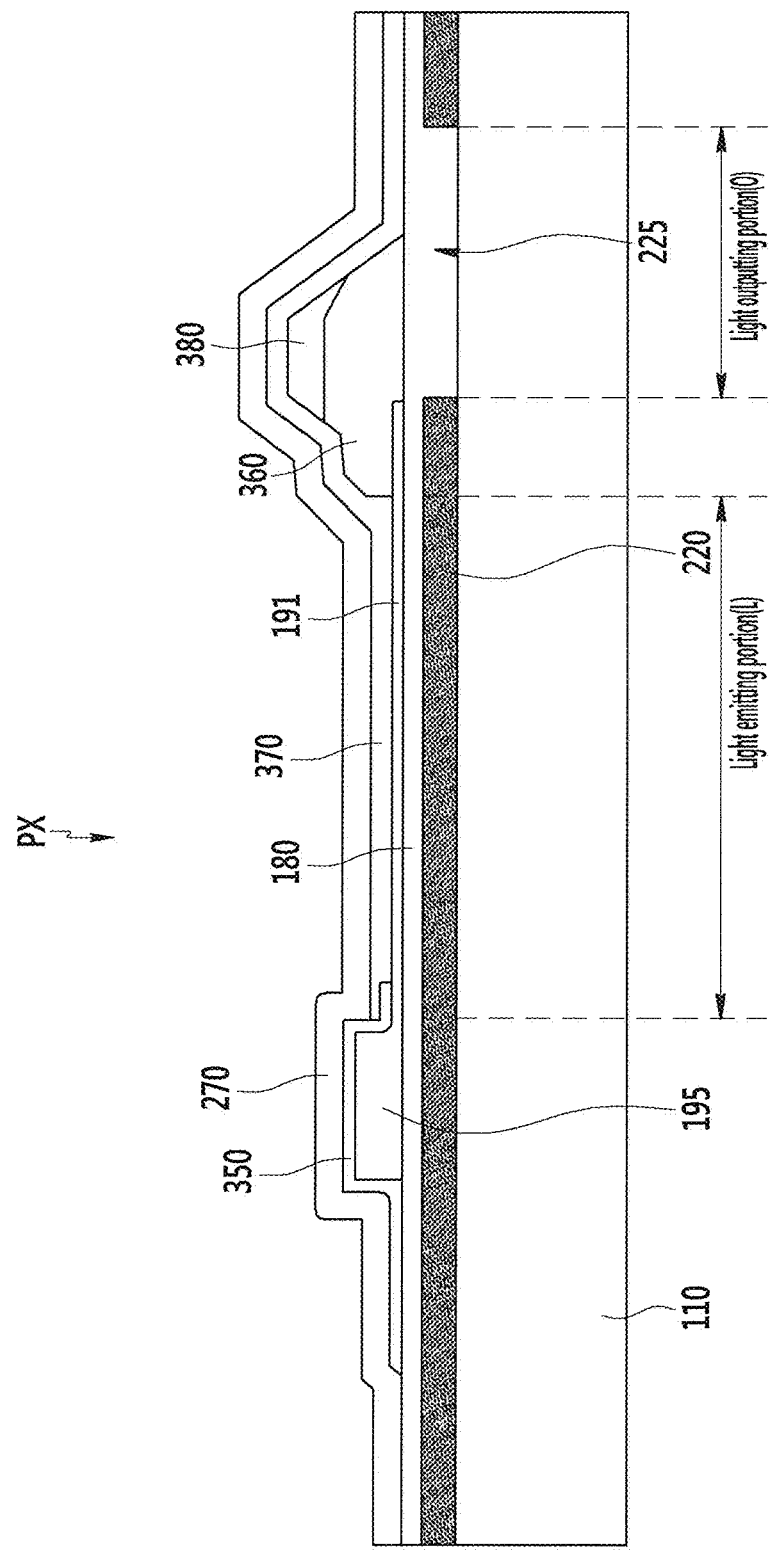

FIG. 2 and FIG. 3 are cross-sectional views of the OLED display according to the example embodiment of the present invention.

Referring to FIG. 2 and FIG. 3, the OLED display according to the example embodiment of the present invention may include an insulation substrate 110. The insulation substrate 110 may include, for example, glass or plastic (such as a polyimide resin, an acryl resin, a polyacrylate resin, a polycarbonate resin, a polyether resin, a polyethylene terephthalate resin, a sulfonic resin, or the like). The insulation substrate 110 may be transparent.

A plurality of signal lines and a semiconductor element coupled to (e.g., connected to) the plurality of signal lines may be provided on the insulation substrate 110. The semiconductor element may be, for example, a thin film transistor, which has a three-terminal structure including a gate electrode, a source electrode, and a drain electrode coupled with (e.g., connected with) the signal lines.

At least one insulating layer 180 is provided on the semiconductor element. The insulating layer 180 may include at least one of an inorganic material (such as a silicon nitride, a silicon oxide, or the like) and an organic material. The organic material may be, for example, an acrylate polymer, a polyimide polymer, a polyamide polymer, a siloxane polymer, a polymer including a photosensitive acryl carboxyl group, a novolac-based resin, an alkali soluble resin, or the like.

A plurality of pixel electrodes 191 are provided on the insulating layer 180. The pixel electrode 191 may be electrically coupled with (e.g., electrically connected with) the drain electrode of the thin film transistor. In this case, the pixel electrode 191 may be electrically coupled with (e.g., electrically connected with) the drain electrode of the thin film transistor through a contact opening (e.g., a contact hole) in the insulating layer 180.

The pixel electrode 191 includes a reflective material that can reflect light. For example, the pixel electrode 191 may include at least one of a metal (such as aluminum, silver, tungsten, gold, chromium, tungsten, molybdenum, titanium, palladium, iridium, and the like, or an alloy thereof) and may include a single layer or a stacked layer structure containing the same.

The pixel electrode 191 may be formed utilizing a sputtering process, a vacuum deposition process, a chemical vapor deposition process, a pulse laser deposition process, a printing process, an atomic layering process, or the like.

In each pixel PX, the pixel electrode 191 is formed to be in all or substantially all of the light emitting portion L, and may extend to an external area of the light emitting portion L (that is, the pixel electrode 191 may extend outside of the light emitting portion 191).

A pixel defining layer (also referred to as a barrier rib) 360 having a plurality of openings that expose the pixel electrode 191 of each pixel PX may be provided on the pixel electrode 191. The openings of the pixel defining layer 360 that expose the pixel electrode 191 may define each pixel area. The pixel defining layer 360 may include an organic material or an inorganic material. For example, the pixel defining layer 360 may include at least one of an organic material (such as a photoresist, a polyacrylate resin, a polyimide resin, an acrylate resin, and the like) and an inorganic material (such as a silicon oxide or a silicon nitride).

The pixel defining layer 360 according to the present example embodiment is provided between neighboring pixels PX. The pixel defining layer 360 may be at a boundary between a light outputting portion O and a light emitting portion L of each pixel PX and at least a portion of the light outputting portion O.

A spacer 380 including an insulating material may further be provided on the pixel defining layer 360. A width of the spacer 380 may be less than that of the pixel defining layer 360 provided therebelow. However, the spacer 380 may be omitted.

The pixel defining layer 360 located in the light outputting portion O and the spacer 380 may include a side wall SW located in the light outputting portion O. The side wall SW is inclined with respect to a surface of the insulation substrate 110, and an inclination angle A is an acute angle in a range of about 30 degrees to about 75 degrees, but this is not restrictive. The side wall SW may face the inclined portion 271 of the opposing electrode 270.

The emission layer 370 is provided on the pixel electrode 191, the pixel defining layer 360, and the spacer 380. The emission layer 370 may include an organic light emitting material.

The emission layer 370 may be made of an organic material emitting light of primary colors (such as red, green, and blue), may have a structure in which a plurality of organic material layers, respectively emitting light of different colors, are layered, or may include an organic material emitting white light (e.g., white color light). For example, a red organic emission layer may be layered in a pixel PX of (displaying) a red color, a green organic emission layer may be layered in a pixel PX of (displaying) a green color, and a blue organic emission layer may be layered in a pixel PX of (displaying) a blue color.

At least one of a hole injecting layer and a hole transport layer may be further provided between the emission layer 370 and the pixel electrode 191 to improve the light emission efficiency of the OLED display. In addition, at least one of an electron transport layer and an electron injecting layer may be further provided on the emission layer 370.

A thickness of the emission layer 370 may be in a range of about 0.1 μm to about 1 μm, and (e.g., in a range of about 0.15 μm to about 0.5 μm) to increase a life-span of the organic light emitting element and prevent deterioration of efficiency due to an increase of a driving voltage, but these ranges are not restrictive. Further, the thickness (e.g., the optimum thickness) of the emission layer 370 may be changed or varied according to a wavelength of a color of the emission layer 370.

As previously described, the reflective portion 195 is located at an edge of the emission layer 370 that faces the light outputting portion O with respect to the light emitting portion L in each pixel PX. The reflective portion 195 defines a side edge of the emission layer 370, and an interface with the emission layer 370 forms a reflective surface that reflects light generated in a neighboring emission layer 370 and is then moved.

Referring to FIG. 2 and FIG. 3, the reflective portion 195 according to the example embodiment of the present invention is located in the same layer at which the pixel electrode 191 is located and may include the same material as the pixel electrode 191. That is, the reflective portion 195 may include a reflective material similar to or the same as the pixel electrode 191 and may include, for example, at least one of a metal (such as aluminum, silver, tungsten, gold, chromium, tungsten, molybdenum, titanium, palladium, iridium, the like, or an alloy thereof), and may include a single layer or a stacked layer structure including the same. In this case, the reflective portion 195 and the pixel electrode 191 may be formed through the same process. The reflective portion 195 and the pixel electrode 191 may be coupled with (e.g., connected with) each other or may be separated from each other.

Referring to FIG. 2, a height different between an upper surface of the reflective portion 195 with respect to an upper surface of the pixel electrode 191, that is, a step difference dG between the pixel electrode 191 and the reflective portion 195, may be in a range of about 0.1 μm to about 1 μm, but this is not restrictive. The step difference dG between the pixel electrode 191 and the reflective portion 195 may have a height that is greater than or equal to the thickness of the emission layer 370 to improve light extraction efficiency (see, e.g., FIG. 3).

The opposing electrode 270 transmitting a common voltage is provided on the emission layer 370.

Similar to the pixel electrode 191, the opposing electrode 270 includes a reflective material that reflects light. For example, the opposing electrode 270 may include at least one of a metal (such as aluminum, silver, tungsten, gold, chromium, tungsten, molybdenum, titanium, palladium, iridium, the like, or an alloy thereof) and may include a single layer or a stacked layer structure including the same.

The opposing electrode 270 may be formed on or over the emission layer 370, the pixel defining layer 360, and the spacer 380 to cover them. In the light outputting portion O, the opposing electrode 270 formed along the side wall SW of the pixel defining layer 360 and the spacer 380 may include the inclined portion 271 and a curved portion 273 extending from (e.g., connected to) the inclined portion 271.

The inclined portion 271 is inclined with respect to a surface of the insulation substrate 110, and an inclination angle A thereof is an acute angle in a range of about 30 degrees to about 75 degrees, but this is not restrictive.

The curved portion 273 couples (e.g., connects) a portion of the opposing electrode 270 of the light emitting portion L and the inclined portion 271. The curved portion 273 may include at least one bent portion or a curved portion (e.g., a smoothly curved portion).

Light reflected between the pixel electrode 191 and the opposing electrode 270 and moved to the side opposite the reflective portion 195 may be reflected by the inclined portion 271 and the curved portion 273 of the opposing electrode 270 when it reaches the light outputting portion O. The light may then be output outwards (that is, out of the pixel PX).

Referring to FIG. 2, an insulating layer 350 is provided between the reflective portion 195 and the opposing electrode 270. The insulating layer 350 insulates between the reflective portion 195 and the opposing electrode 270. The insulating layer 350 may be formed on a side of the reflective portion 195, and thus, may be provided between the reflective portion 195 and the emission layer 370.

For more efficient light reflection between the reflective portion 195 and the emission layer 370, a refractive index of the insulating layer 350 may be lower than that of the emission layer 370. As a refractive difference between the emission layer 370 and the insulating layer 350 is increased, a total reflection rate may be increased, thereby reducing light loss. For example, the refractive index of the insulating layer 350 may be less than or equal to about 1.4, and in this case, light leakage at a side surface may be effectively prevented. This will be further described later with reference to results of a simulation.

Referring to FIG. 3, an OLED display according to an example embodiment of the present invention may further include a light blocking member 220 that includes an opening 225 that corresponds to the light outputting portion O. The light blocking member 220 prevents an area or areas other than the light outputting portion O, that is, a light emitting portion L and other portions, from being viewed or visible from the outside of the display by covering the area or areas. The light blocking member 220 may be provided below the emission layer 370, and for example, the light blocking member 220 may be provided between the insulation substrate 110 and the emission layer 370 or on an external side of the insulation substrate 110. FIG. 3 illustrates an example embodiment in which the light blocking member 220 is provided between the insulation substrate 110 and the insulating layer 180.

Because light generated in the emission layer 370 is output outwards only through the light outputting portion O due to the light blocking member 220, increased (or maximum) light extraction efficiency may be achieved using (utilizing or with) a relatively small opening. In addition, internal light is output only through the light outputting portion O and the remaining areas are covered by the light blocking member 220. Therefore, absorption and reflectance of the external light are significantly reduced, and an external reflective layer (such as a polarizer) that reduces reflection of external light may not be necessary or desired.

As described, light outputting efficiency of the OLED display may be increased, and therefore, power consumption may be reduced.

The pixel electrode 191, the emission layer 370, and the opposing electrode 270 of each pixel PX form an organic light emitting element, and either the pixel electrode 191 or the opposing electrode 270 acts as a cathode and the other of the pixel electrode 191 and the opposing electrode 270 acts as an anode.

The OLED display according to the example embodiment of the present invention may be a bottom emission display that emits light generated in the emission layer 370 toward a rear side (e.g., a bottom side) of the insulation substrate 110 to display an image.

An encapsulation layer may be further provided on the opposing electrode 270 to prevent permeation of moisture and/or oxygen from the external side therethrough by encapsulating the organic light emitting element.

Hereinafter, a method for manufacturing an OLED display according to an example embodiment of the present invention will be described with reference to FIG. 4 to FIG. 11.

FIG. 4 to FIG. 14 are cross-sectional views that sequentially illustrate a method for manufacturing an OLED display according to the example embodiment of the present invention.

Figure 4:
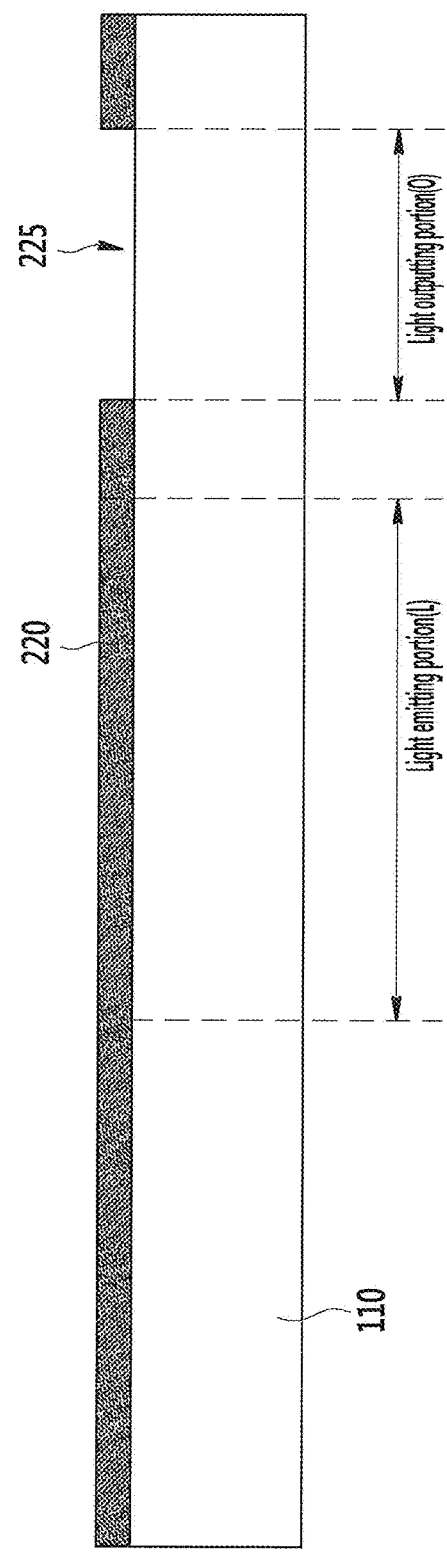
FIG. 4 to FIG. 14 are cross-sectional views sequentially illustrating a manufacturing method of the OLED display according to the example embodiment of the present invention.

First, referring to FIG. 4, a light blocking material is coated on the insulation substrate 110, and a portion corresponding to the light outputting portion O is removed or etched (e.g., eliminated) to form the light blocking member 220 including the opening 225 that corresponds to the light outputting portion O.

Figure 5:
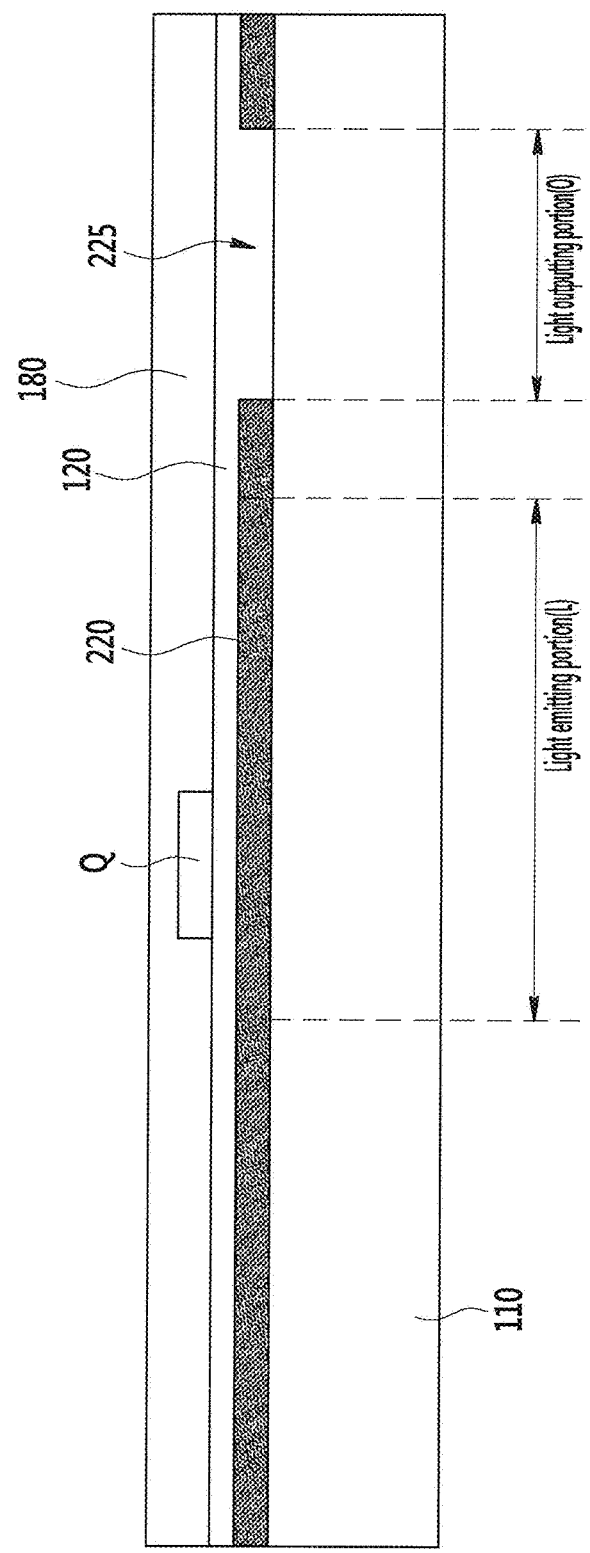

Then, referring to FIG. 5, an insulating layer 120 may be formed by coating an inorganic insulating material on the light blocking member 220. However, formation of the insulating layer 120 may be omitted. Sequentially, a plurality of thin films are layered on the insulating layer 120 and then etched to form a semiconductor element Q, such as a thin film transistor. Then, the insulating layer 180 is formed by layering an organic insulating material or an inorganic insulating material on the semiconductor element Q, and a contact opening (e.g., a contact hole) that exposes a drain electrode of the semiconductor element Q is formed therein.

Figure 6:
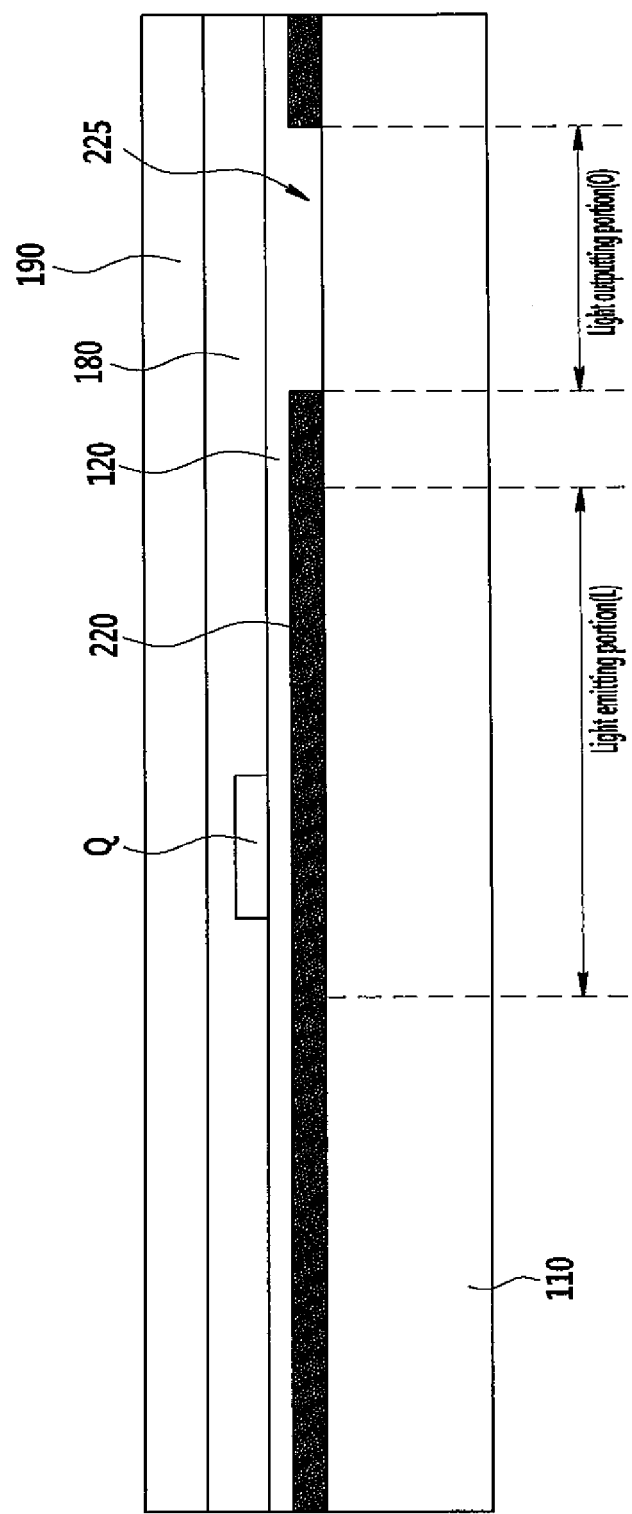

Next, referring to FIG. 6, a pixel electrode layer 190 is formed by layering a reflective conductive material on the insulating layer 180. The reflective conductive material may include at least one of a metal (such as aluminum, silver, tungsten, gold, chromium, tungsten, molybdenum, titanium, palladium, iridium, the like, or an alloy thereof).

Figure 7:
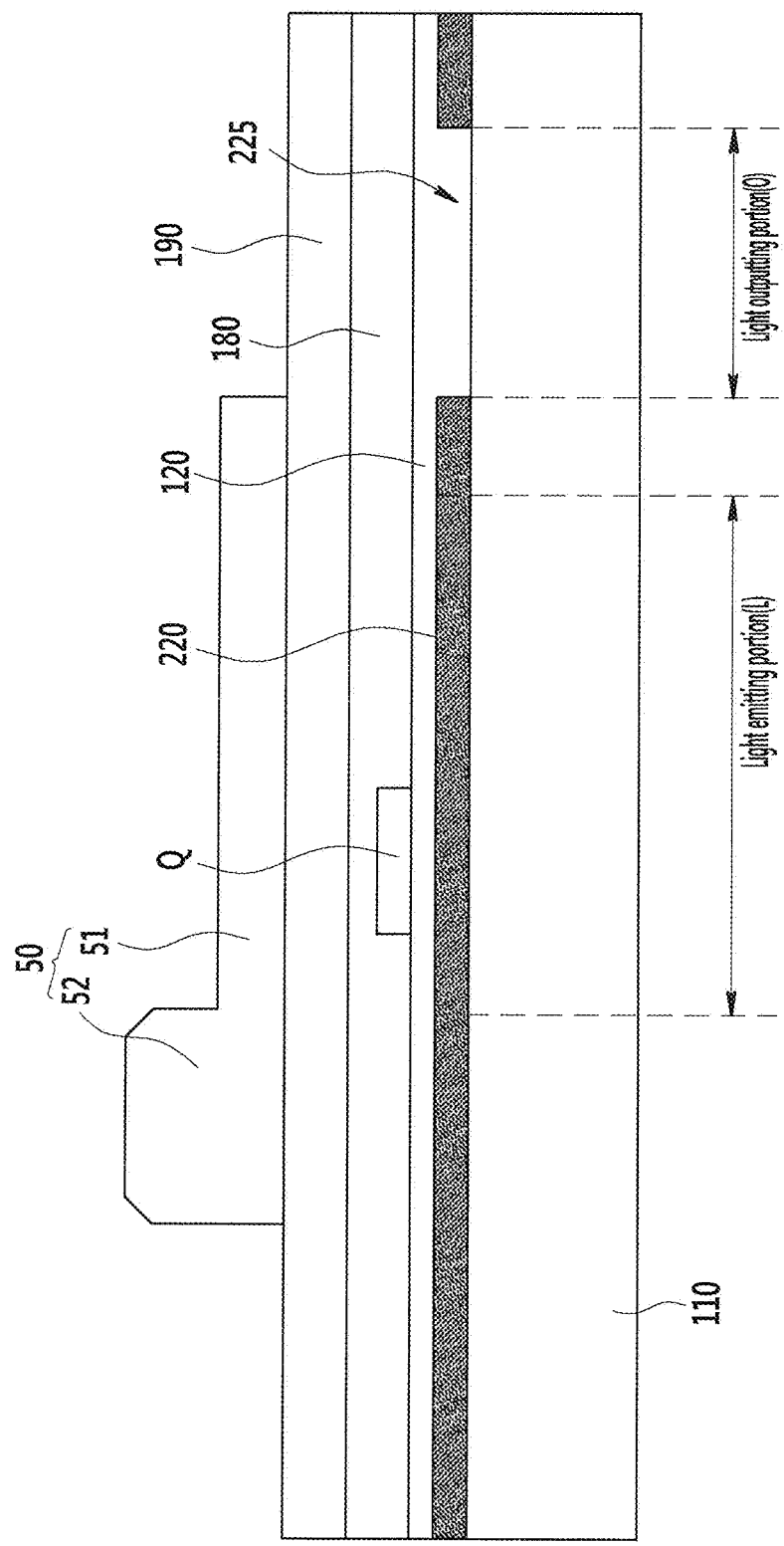

Referring to FIG. 7, a photoresist is coated on the pixel electrode layer 190 and then patterned to form a photoresist pattern 50 that includes a thin portion 51 and a thick portion 52. All or substantially all of the photoresist pattern 50 is provided in the light emitting portion L, but the photoresist pattern 50 may partially extend into the light outputting portion O.

Figure 8:
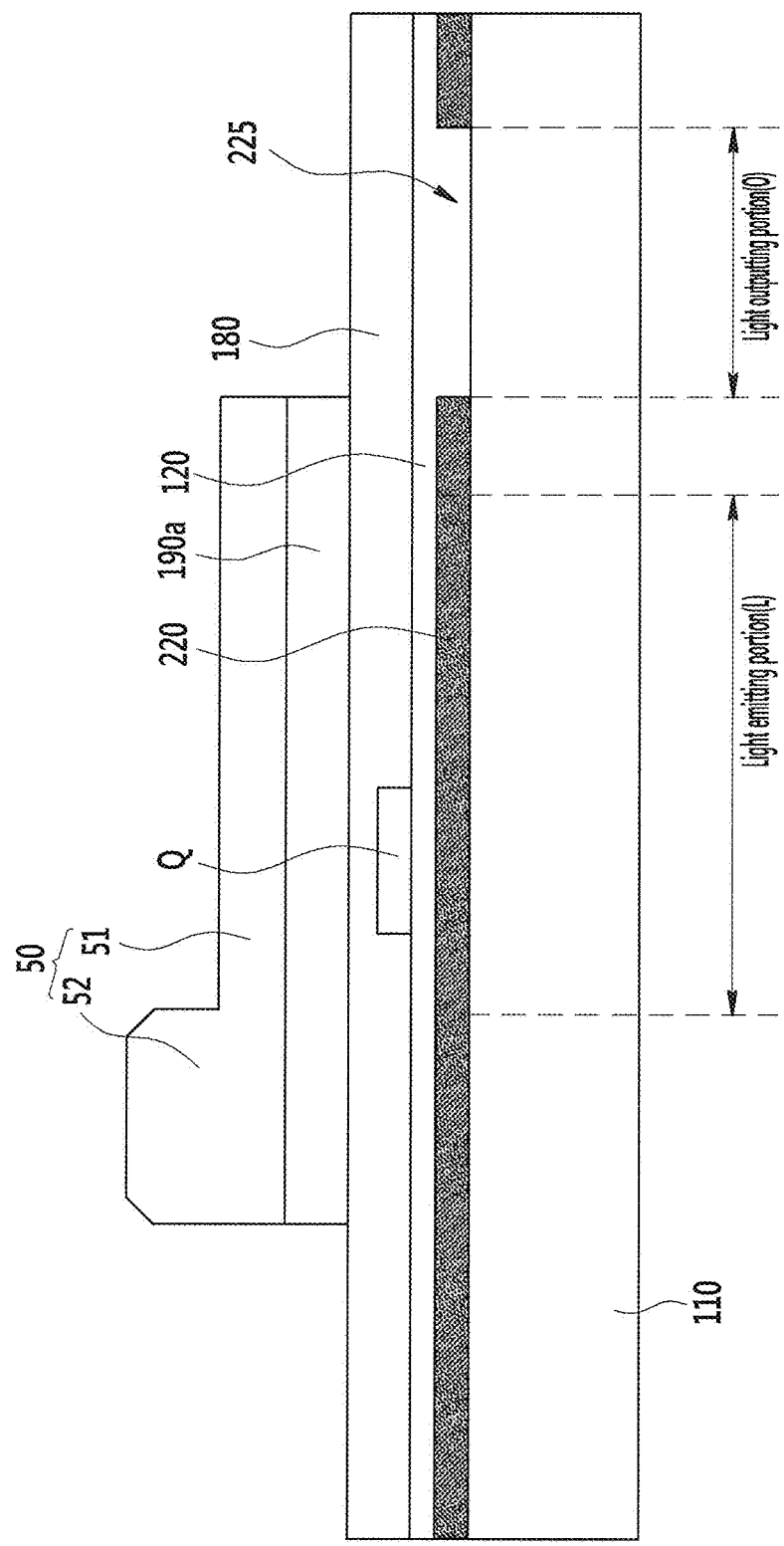

Referring to FIG. 8, the pixel electrode layer 190 is etched using (utilizing) the photoresist pattern 50 as an etching mask so as to form a pixel electrode pattern 190a.

Figure 9:
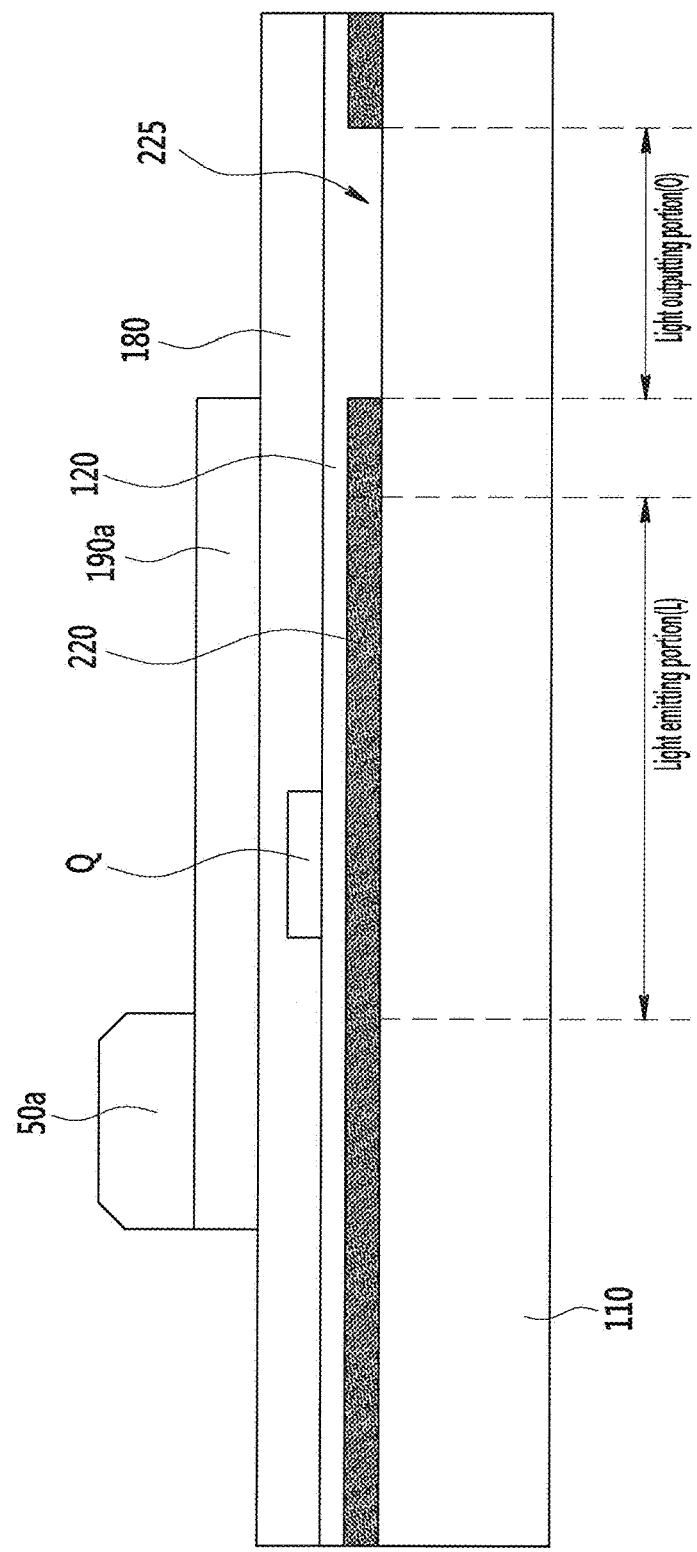

Then, referring to FIG. 9, an upper surface of the photoresist pattern 50 is etched to remove (e.g., eliminate) the thin portion 51, and a photoresist pattern 50a is formed. The photoresist pattern 50a is provided at a location corresponding to the previous thick portion 52 of the photoresist pattern 50, and may have a thickness that is less than that of the previous thick portion 52.

Figure 10:
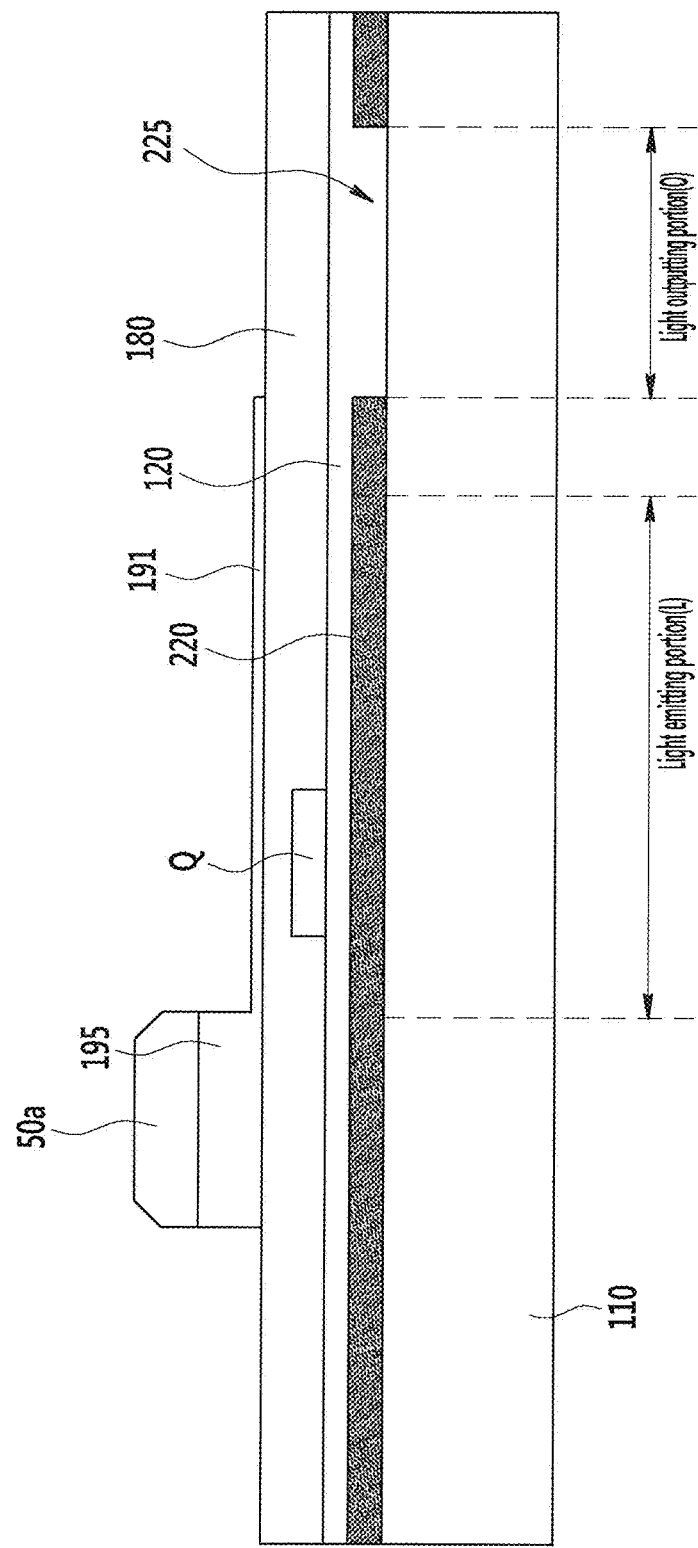

Next, referring to FIG. 10, the pixel electrode pattern 190a is etched using (utilizing) the photoresist pattern 50a as an etching mask to form the pixel electrode 191 and the reflective portion 195. The reflective portion 195 is a portion of the previous pixel electrode pattern 190a located below the photoresist pattern 50a, and the remaining portion of the previous pixel electrode pattern 190a corresponds to the pixel electrode 191. In this case, the thickness of the pixel electrode 191 may be adjusted by controlling an etching rate.

In the present example embodiment, the pixel electrode 191 and the reflective portion 195 provided at the same layer and including the same material may be formed by various methods other than the example embodiment shown in FIG. 6 to FIG. 10.

Figure 11:
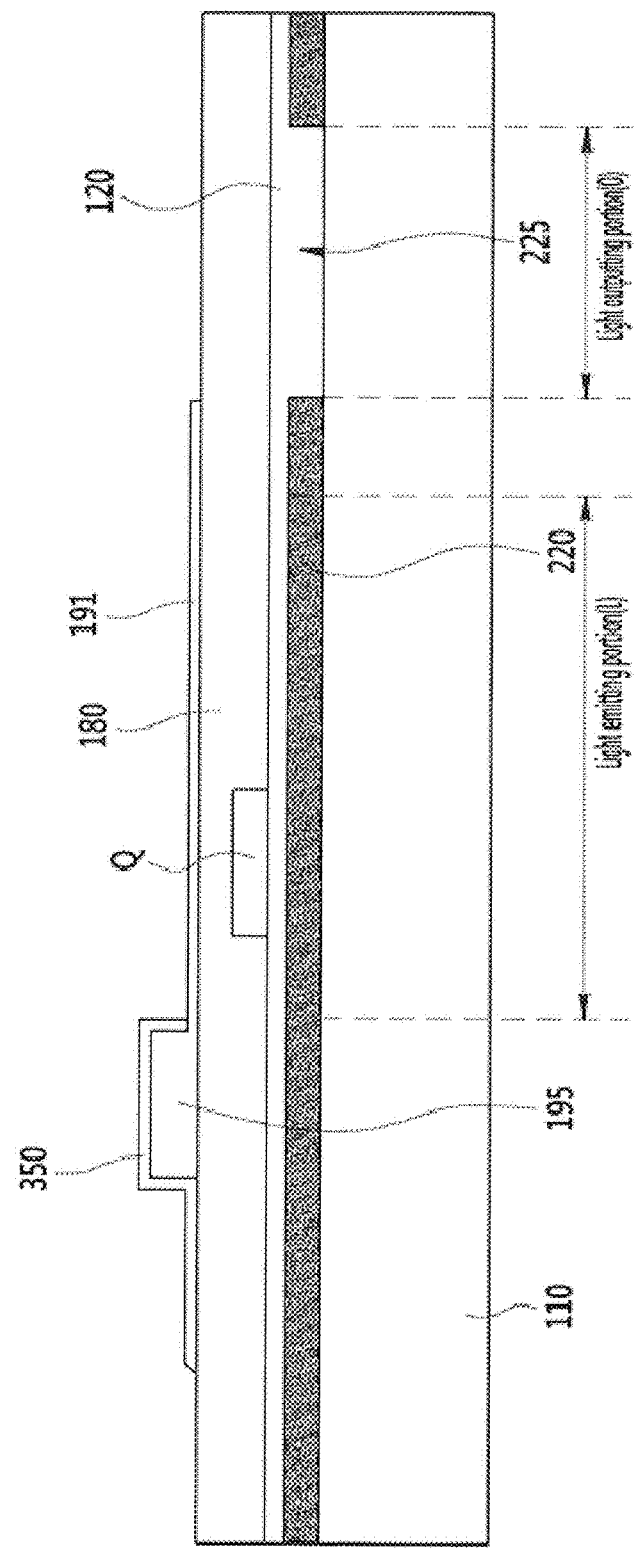

Referring to FIG. 11, an inorganic insulating material or an organic insulating material is layered on the reflective portion 195 and the pixel electrode 191, and the insulating material is then patterned to form the insulating layer 350 on the reflective portion 195. In this case, the insulating layer 350 may cover a side surface of the reflective portion 195.

Figure 12:
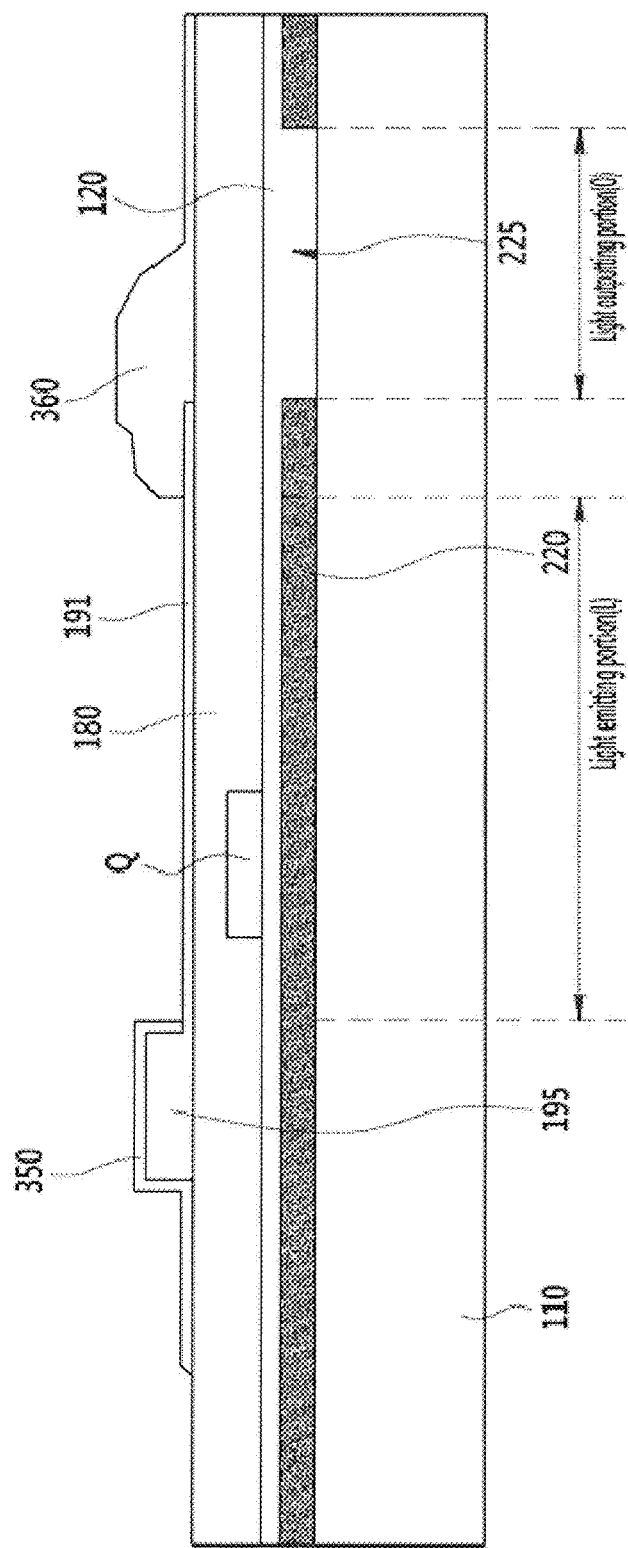

Referring to FIG. 12, an organic material or an inorganic material is coated on the pixel electrode 191 and the insulating layer 350, and the organic material or the inorganic material is then patterned to form a boundary of the light emitting portion L and the light outputting portion O. A pixel defining layer 360 provided in an area corresponding to the light outputting portion O.

Figure 13:
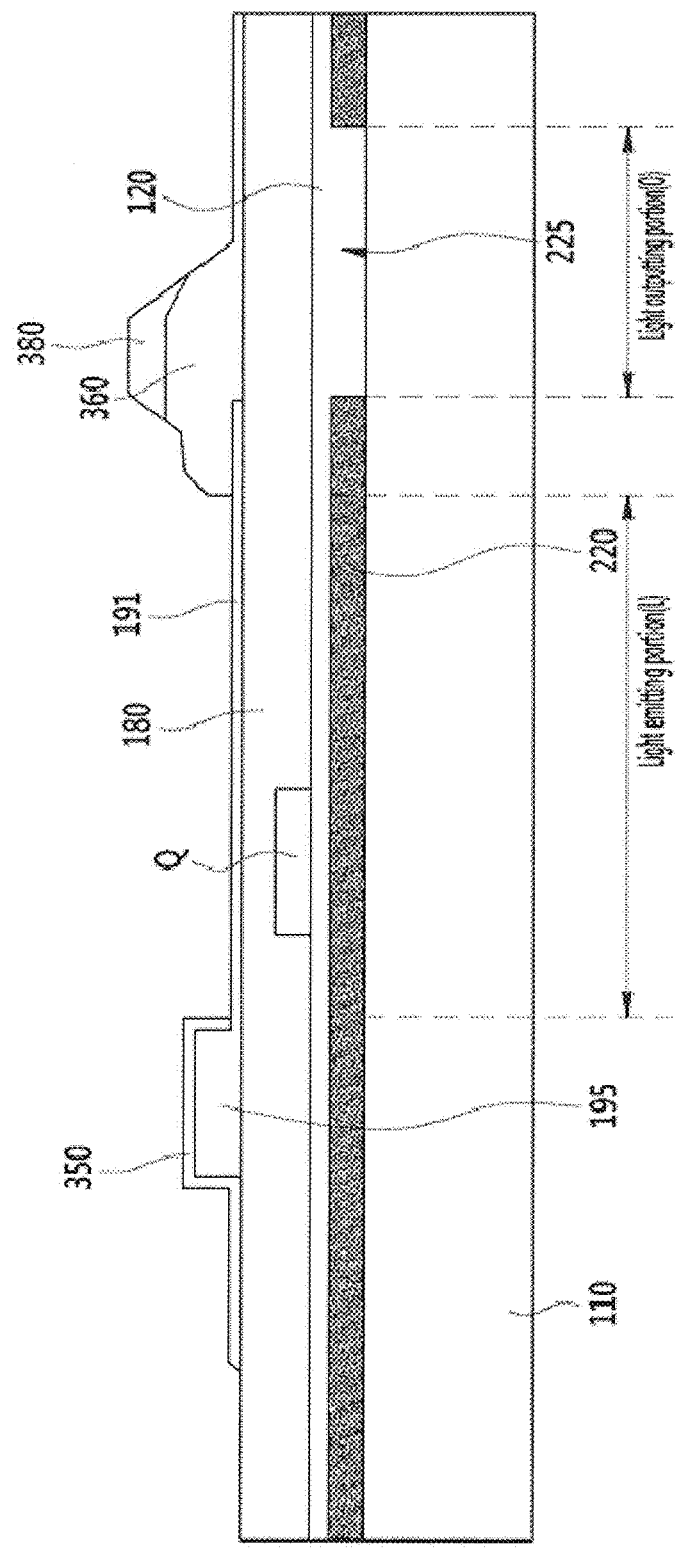

Referring to FIG. 13, the spacer 380 may further be formed on the pixel defining layer 360.

Figure 14:
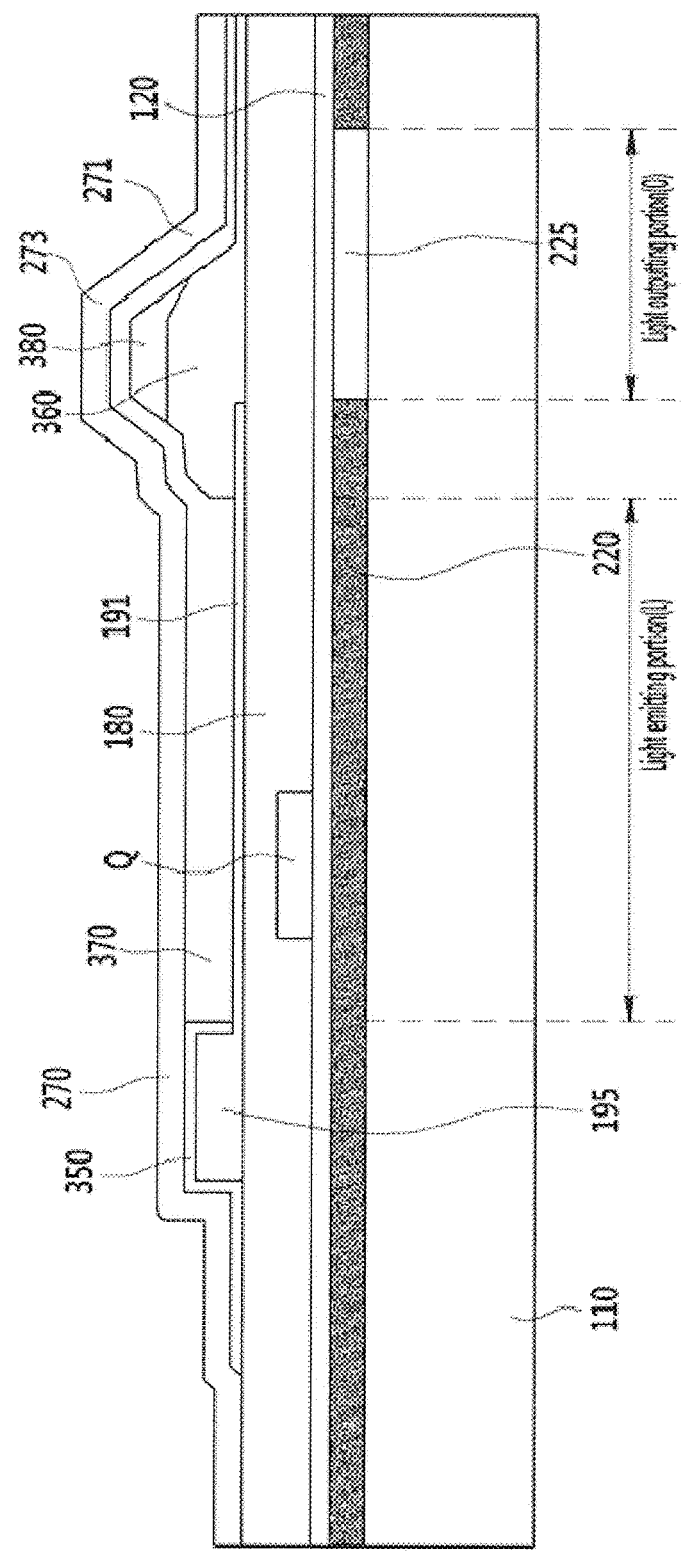

Referring to FIG. 14, the emission layer 370 is formed in an area surrounded by the reflective portion 195 and the pixel defining layer 360. The emission layer 370 may extend to upper and side surfaces of the pixel defining layer 360. Sequentially, a reflective conductive material is layered on the emission layer 370 to form the opposing electrode 270. The reflective conductive material may include at least one of a metal (such as aluminum, silver, tungsten, gold, chromium, tungsten, molybdenum, titanium, palladium, iridium, the like, or an alloy thereof). The opposing electrode 270 includes the inclined portion 271 and the curved portion 273 formed by the step difference of the pixel defining layer 360.

Hereinafter, an OLED display according to an example embodiment of the present invention will be described with reference to FIG. 2, FIG. 3, and FIG. 15.

Figure 15:
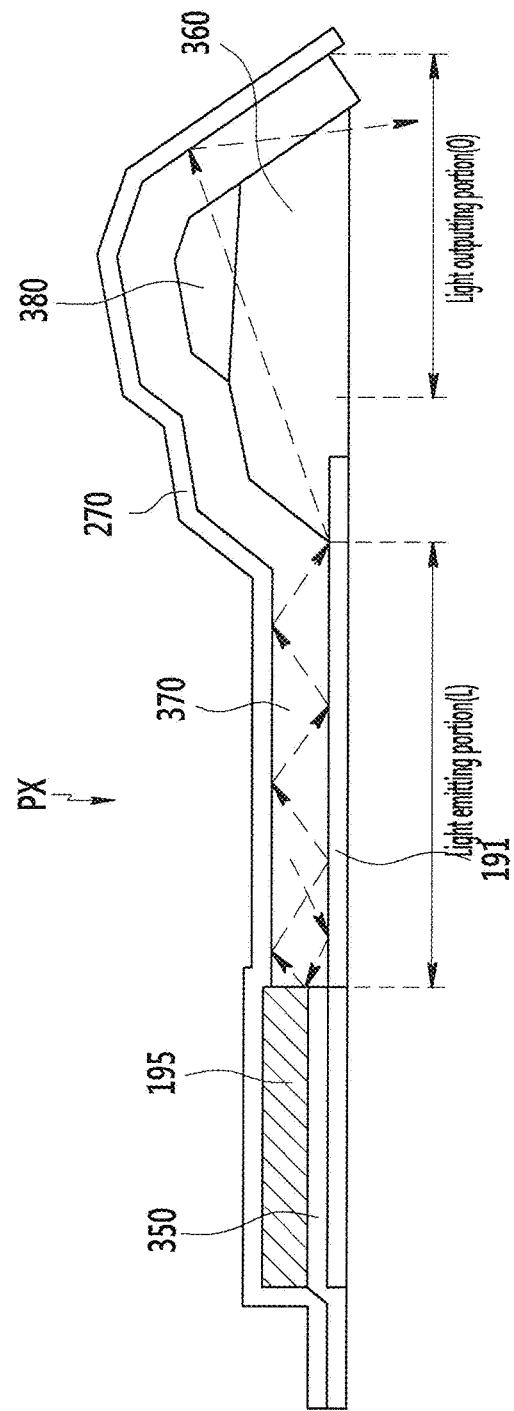
FIG. 15 is a cross-sectional view of the OLED display according to the example embodiment of the present invention.

FIG. 15 is a cross-sectional view of an OLED display according to an example embodiment of the present invention.

Referring to FIG. 15, the OLED display according to the example embodiment of the present invention is substantially the same as the OLED display according to the example embodiment shown in FIG. 2 and FIG. 3, except for the pixel electrode 191 and the reflective portion 195.

The reflective portion 195 may be provided at (or in) a layer that is different from the layer of the pixel electrode 191. For example, the reflective portion 195 may be provided at a lower portion or an upper portion of the pixel electrode 191. FIG. 15 illustrates an example embodiment in which the reflective portion 195 is provided at the upper portion of the pixel electrode 191.

The pixel electrode 191 may extend to a lower portion of the reflective portion 195, or the pixel electrode 191 may not be provided at the lower portion of the reflective portion 195. When the pixel electrode 191 is provided at the lower portion of the reflective portion 195, as shown in FIG. 15, the insulating layer 350 is provided between the reflective portion 195 and the pixel electrode 191 for insulation therebetween.

When the reflective portion 195 is provided at an upper portion of the pixel electrode 191, the reflective portion 195 may be coupled (e.g., connected to) the pixel electrode 191 while contacting the opposing electrode 270 provided at an upper portion of the reflective portion 195.

As in the previously described example embodiment, the reflective portion 195 includes a reflective surface that reflects light generated in the emission layer 370 of the light emitting portion L. The reflective portion 195 causes light to be generated, reflected, and then transmitted from the light emitting portion L to move toward the light outputting portion O and controls or guides light to be output only through at least one light outputting portion O with respect to one pixel PX. For example, the light may be output through the light outputting portion O disposed adjacently at a side of the light emitting portion L. The reflective portion 195 may include a reflective material, for example, a reflective metallic material that is the same as or different from that of the pixel electrode 191.

The reflective portion 195 defines a side edge of the emission layer 370 of the light emitting portion L, and an interface between the reflective portion 195 and the emission layer 370 forms a reflective surface that reflects light generated in and moved from a neighboring emission layer 370.

The thickness of the reflective portion 195 may be in a range of about 0.1 μm to about 1 μm, but this is not restrictive.

Hereinafter, various examples of a layout of the light outputting portion O, the light emitting portion L, and the reflective portion 195 of an OLED display according to example embodiments of the present invention will be described with reference to the above-described drawings and FIG. 16 to FIG. 32.

Figure 16:
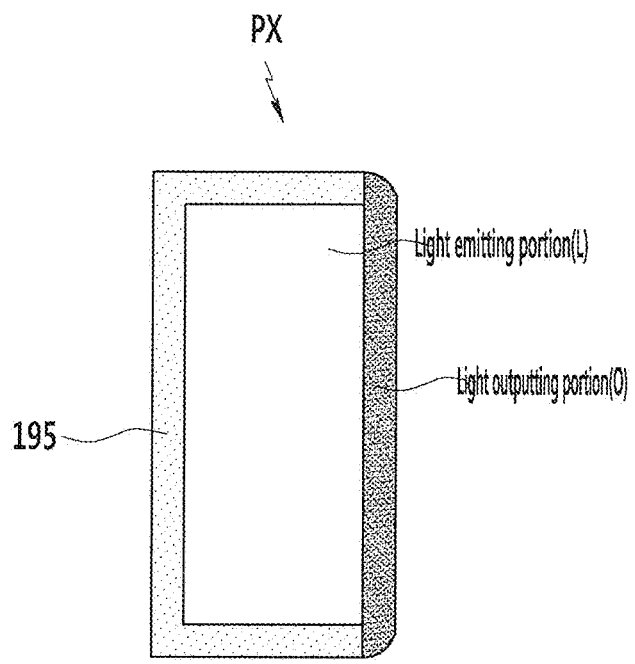
FIG. 16 is a schematic top plan view of one pixel of the OLED display according to the example embodiment of the present invention.
Figure 29:
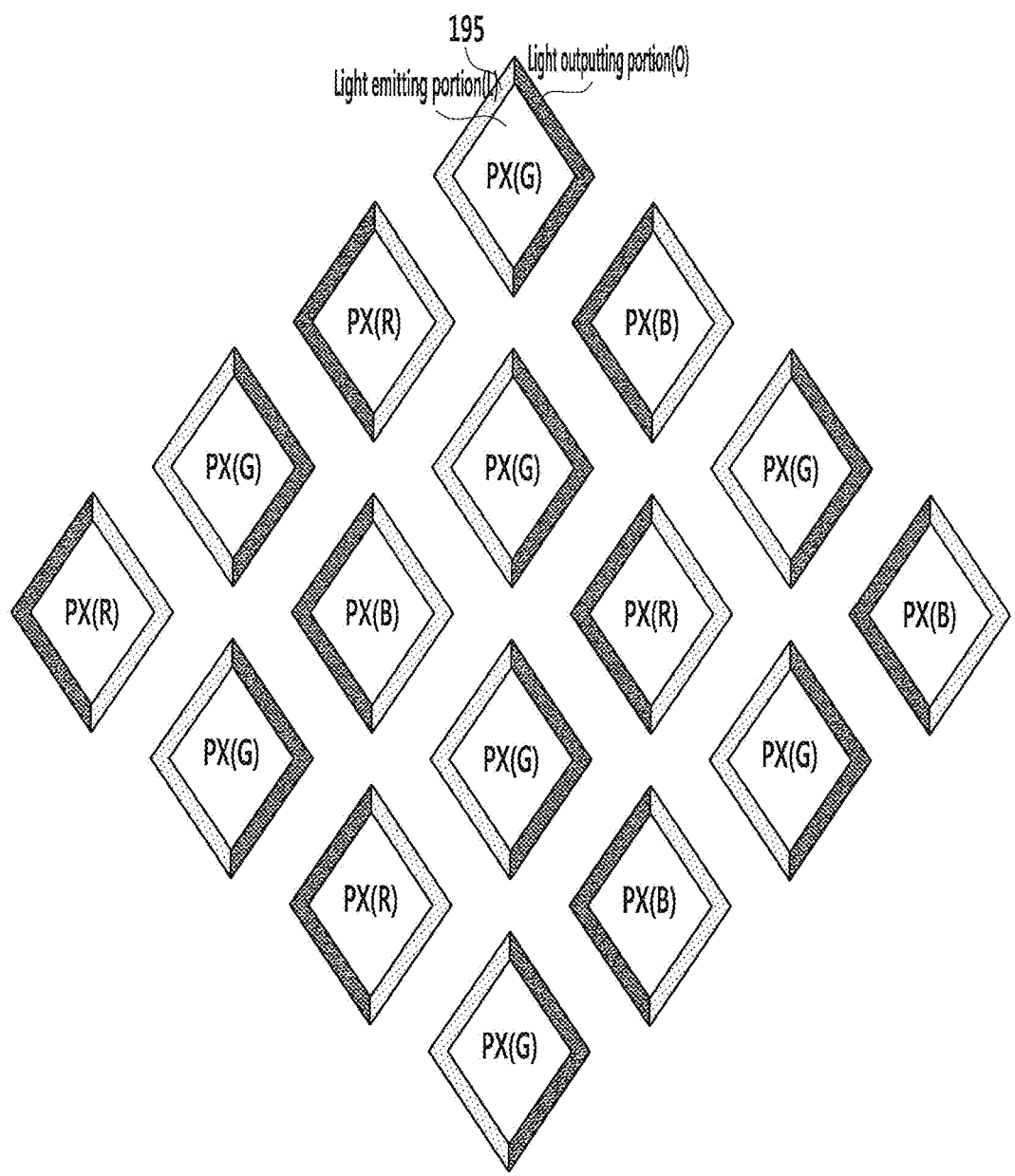
Figure 30:
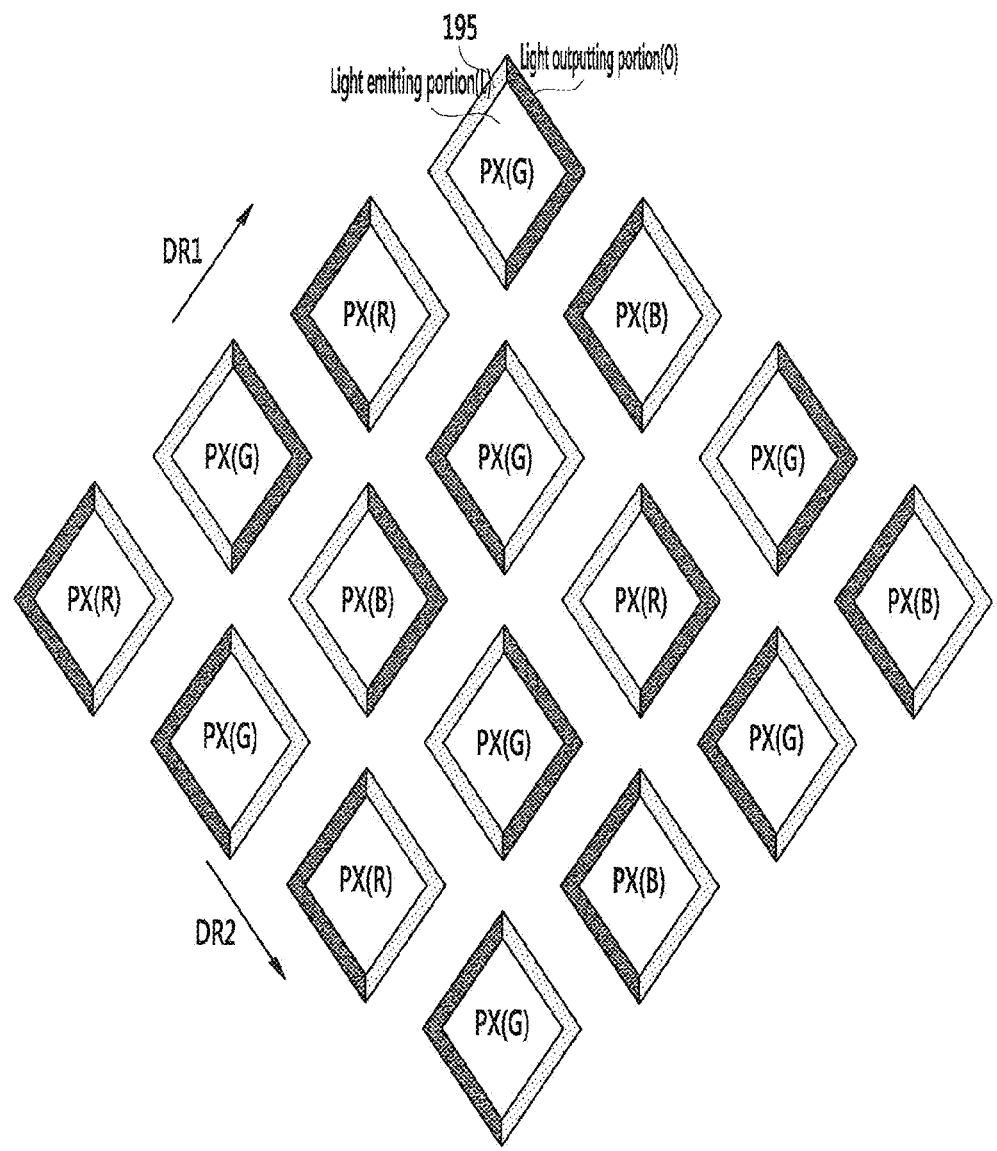
Figure 31:
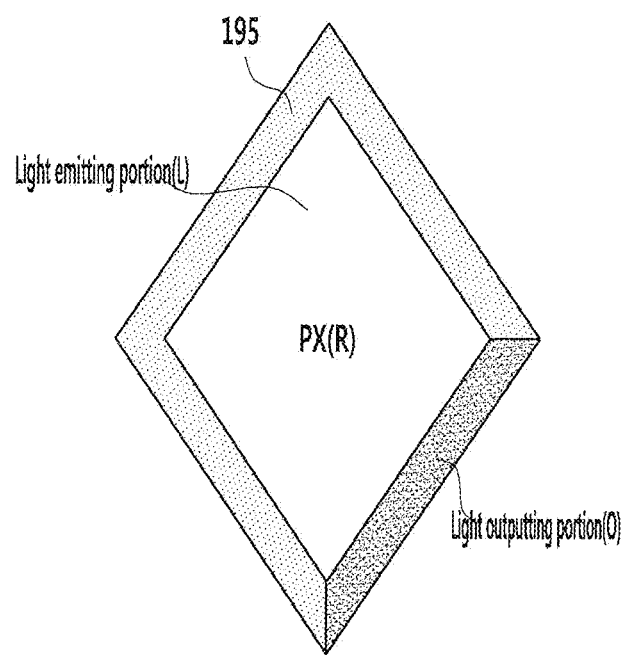
FIG. 31 is a schematic top plan view of one pixel of the OLED display according to the example embodiment of the present invention.
Figure 32:
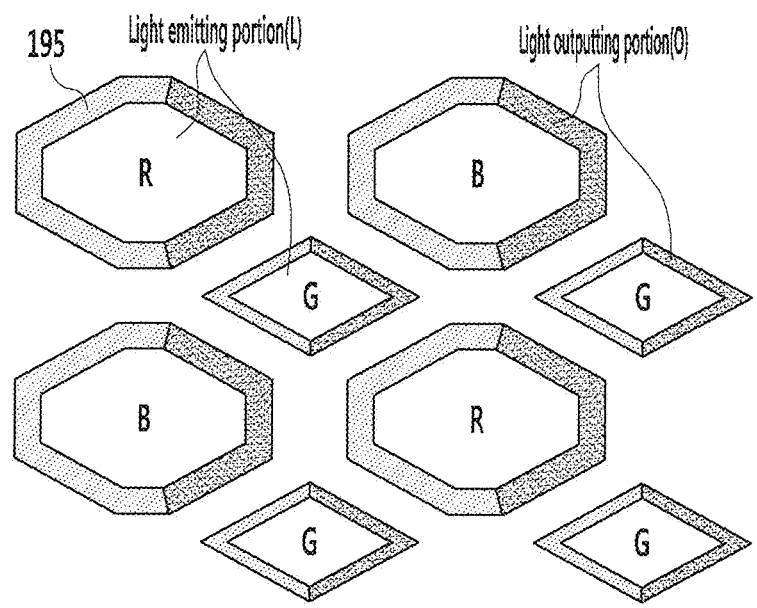
FIG. 32 is a schematic top plan view of one pixel of the OLED display according to the example embodiment of the present invention.
Figure 33:
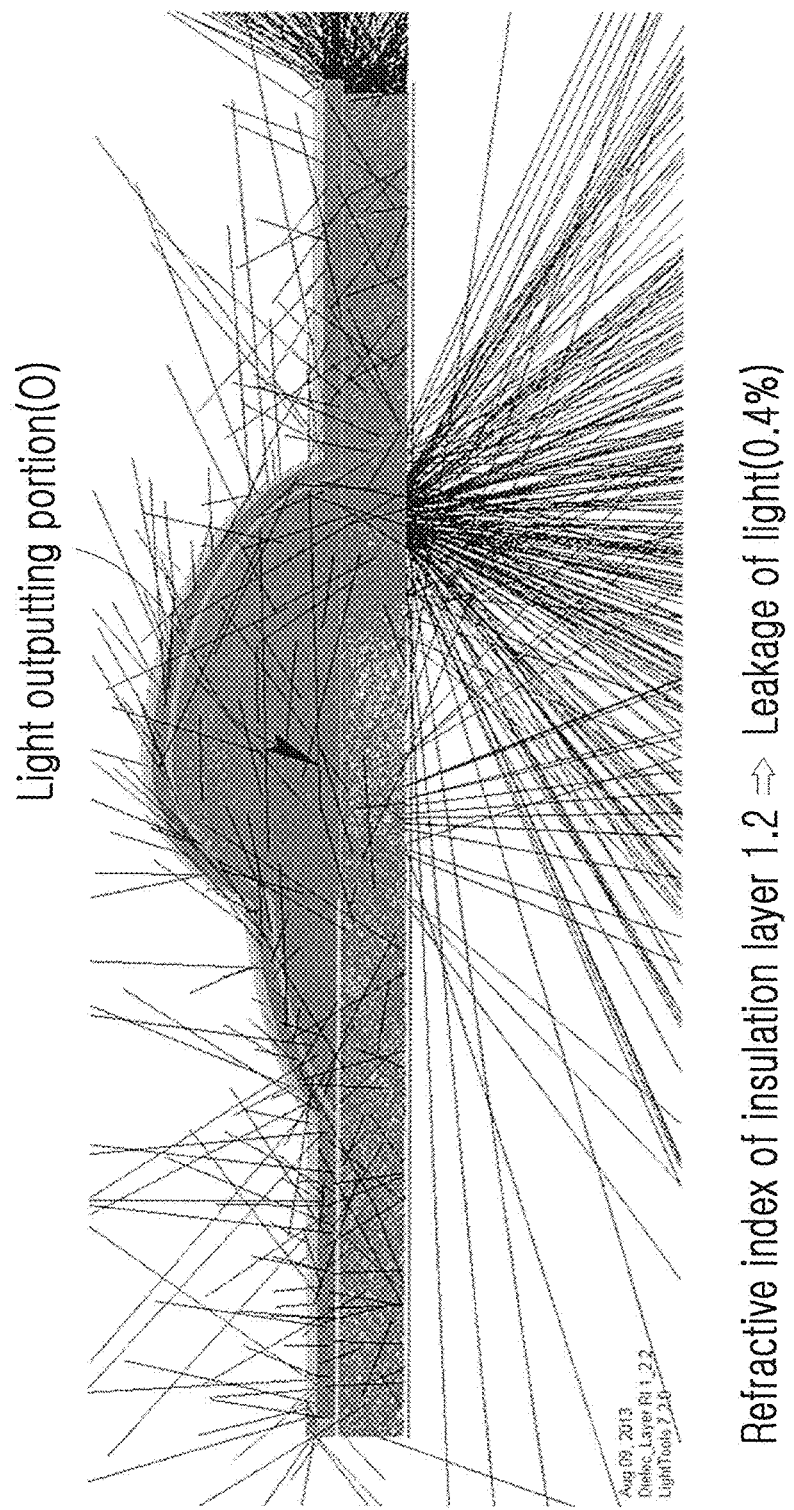
FIG. 33 to FIG. 36 illustrate simulation results of a degree of side light leakage according to various refractive indexes of an insulating layer of the OLED display according to the example embodiment of the present invention.
Figure 34:
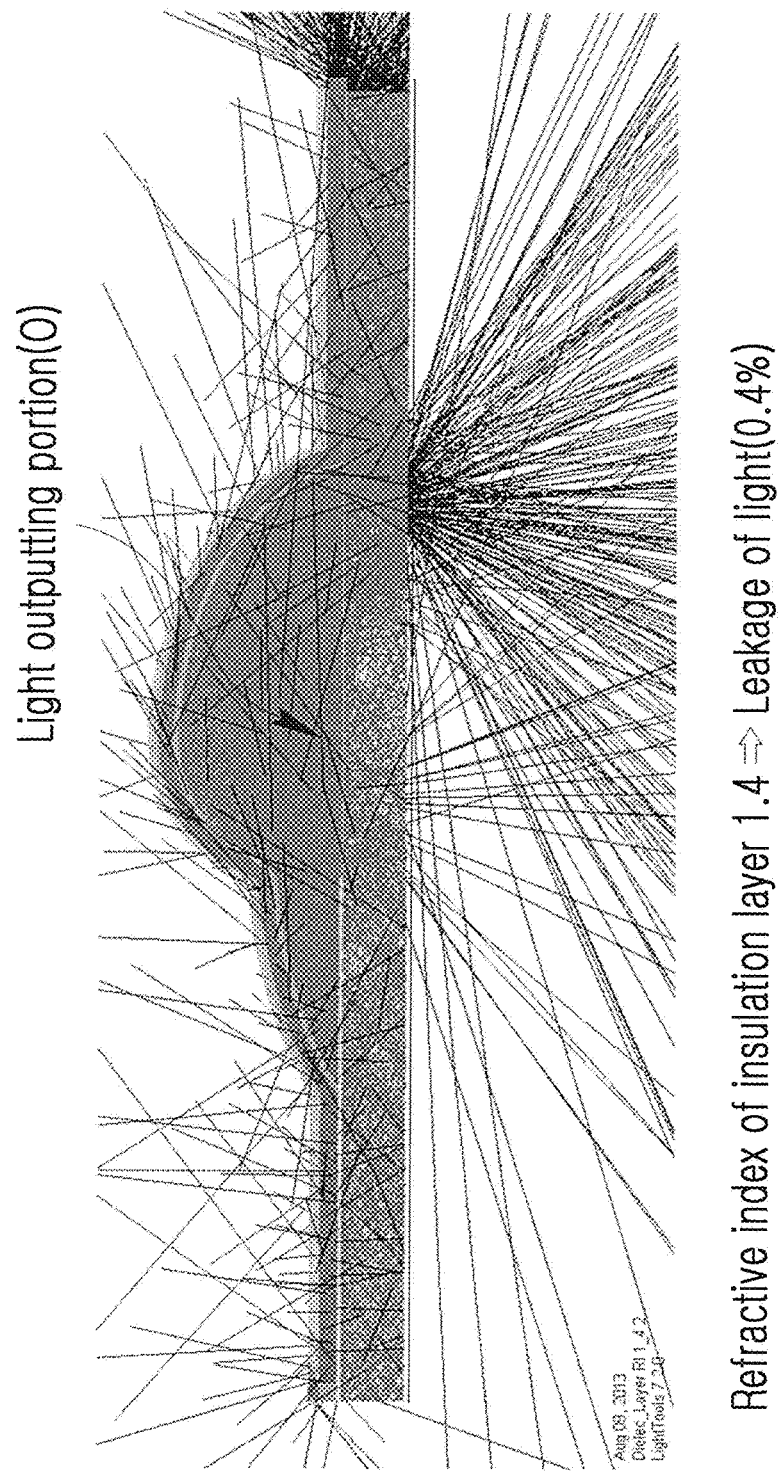
Figure 35:
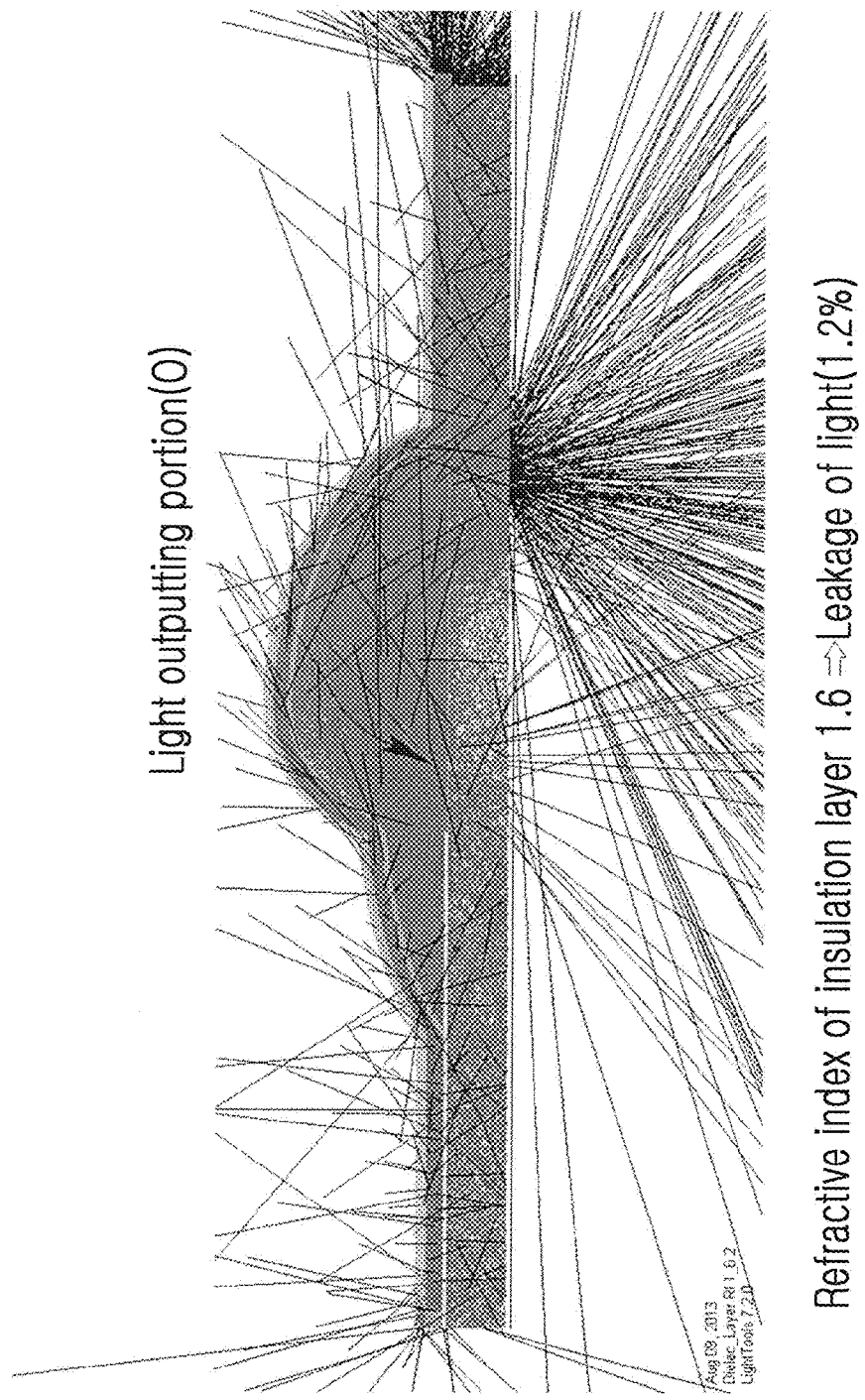
Figure 36:
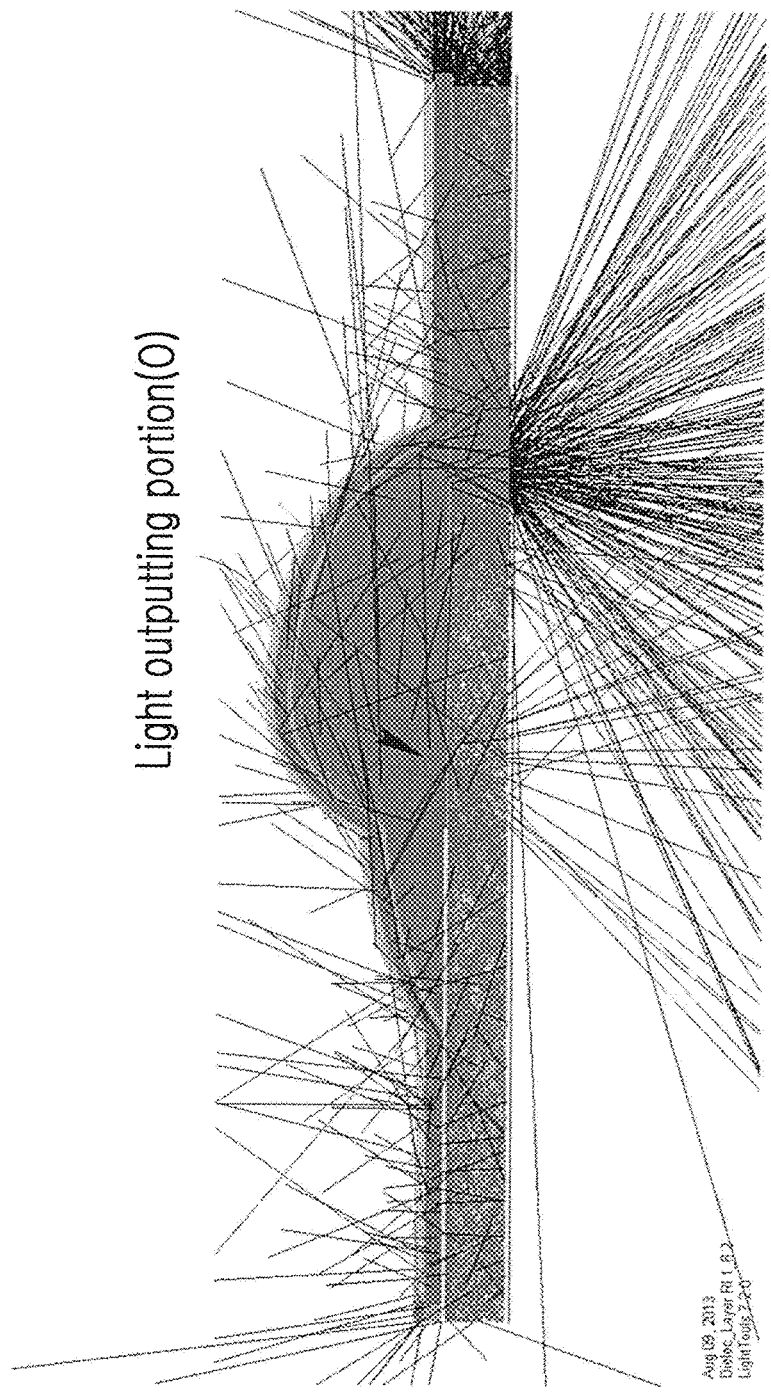

First, FIG. 16 is a schematic top plan view of one pixel of the OLED display according to the example embodiment of the present invention, FIG. 17 to FIG. 21 are layout views of the OLED display according to example embodiments of the present invention, FIG. 22 to FIG. 25 are schematic top plan views of one pixel of the OLED display according to example embodiments of the present invention, FIG. 26 to FIG. 30 are layout views of the OLED display according to example embodiments of the present invention, FIG. 31 is a schematic top plan view of one pixel of the OLED display according to an example embodiment of the present invention, and FIG. 32 is a schematic top plan view of one pixel of the OLED display according to an example embodiment of the present invention.

First, referring to FIG. 16, a periphery of a light emitting portion L included in one pixel PX is surrounded by a light outputting portion O and a reflective portion 195. The light outputting portion L may be located neighboring (adjacent to) one edge of the light emitting portion L, and the reflective portion 195 may be located at (adjacent to) the remaining edges of the light outputting portion L. When the pixel PX is substantially formed in the shape of a quadrangle, the light outputting portion O may be formed corresponding to at least one side or a part of one side of the quadrangle. FIG. 16 illustrates an example embodiment in which the light outputting portion O is formed corresponding to one side of the pixel PX. In this case, the reflective portion 195 may be formed corresponding to the other sides of the pixel PX.

Referring to FIG. 17 to FIG. 21, an OLED display according to an example embodiments of the present invention may include a plurality of pixels PX arranged substantially in a matrix form. The plurality of pixels PX may respective have the same shape. Pixels PX arranged along each column may represent (display) the same primary color, and pixels arranged along a row direction may represent (display) different primary colors.

Figure 17:
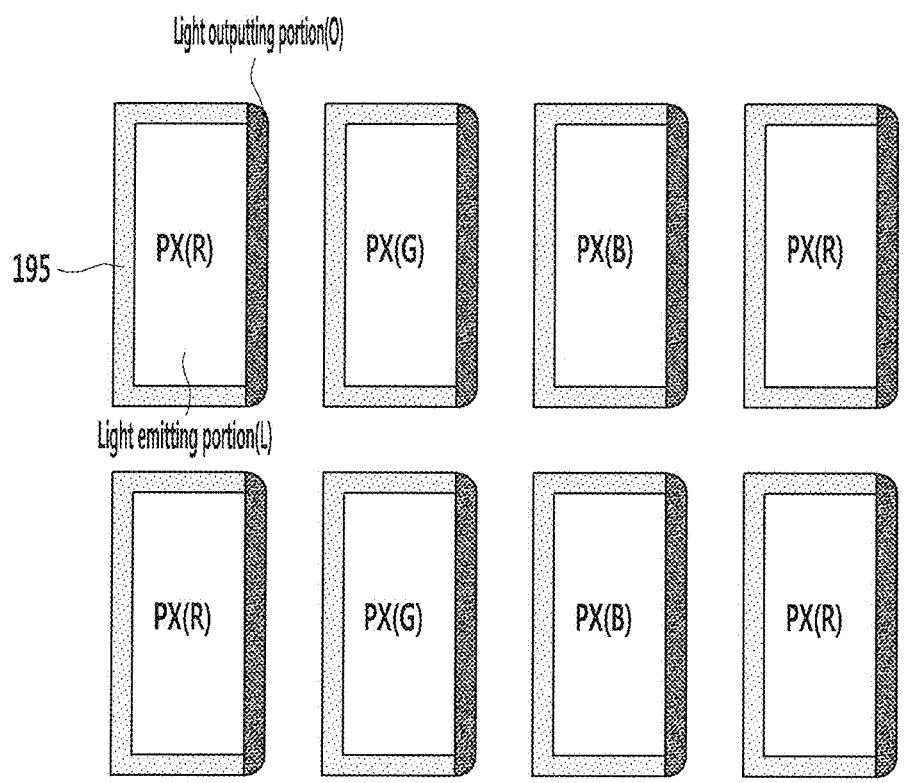
FIG. 17 to FIG. 21 are layout views of the OLED display according to the example embodiment of the present invention.

Referring to FIG. 17, locations of light outputting portions O of each of the pixels PX arranged along the same column and/or the same row may be equivalent to each other (that is, may be at the same location in each respective pixel PX), and locations of light outputting portions O of each of the pixels PX arranged along different columns and/or different rows may also be equivalent to each other. In this case, light outputting portions O may each be located at the right side of each respective pixel PX.

Figure 18:
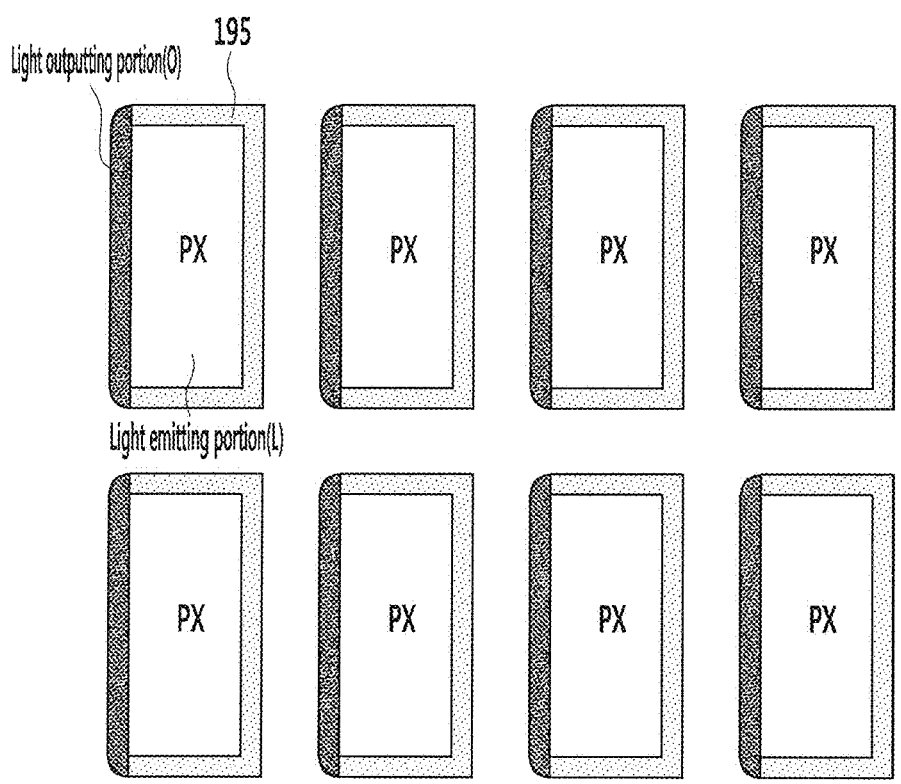

Referring to FIG. 18, the present example embodiment is substantially similar to the example embodiment shown in FIG. 17, except that light outputting portions O are located at the left side of each respective pixel PX.

Figure 19:
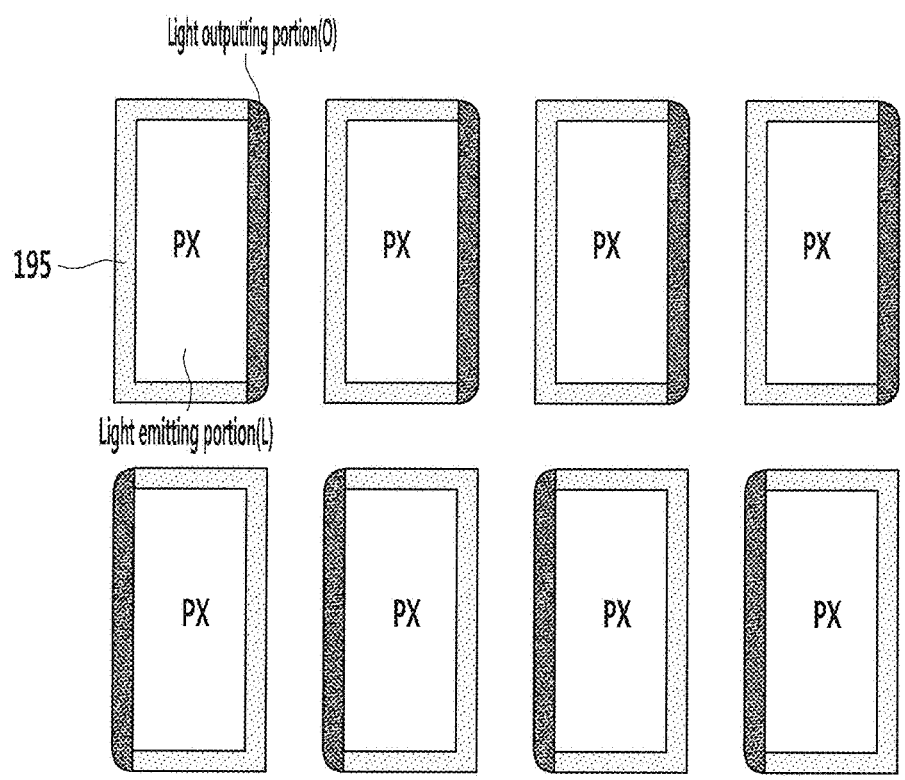

Referring to FIG. 19, locations of light outputting portions O of pixels PX arranged along the same row are equivalent to each other (that is, are at the same location in each respective pixel PX), but locations of light outputting portions O of pixels PX arranged along different rows may be different from each other (that is, may be at different locations in each respective pixel PX). For example, locations of light outputting portions O of pixels PX arranged along adjacent rows may be opposite to each other. Accordingly, locations of light outputting portions O of pixels PX arranged along one column may alternate in each row. However, the present embodiment is not limited thereto, and locations of light outputting portions O of pixels PX arranged along one column may alternate in every two or more rows.

Figure 20:
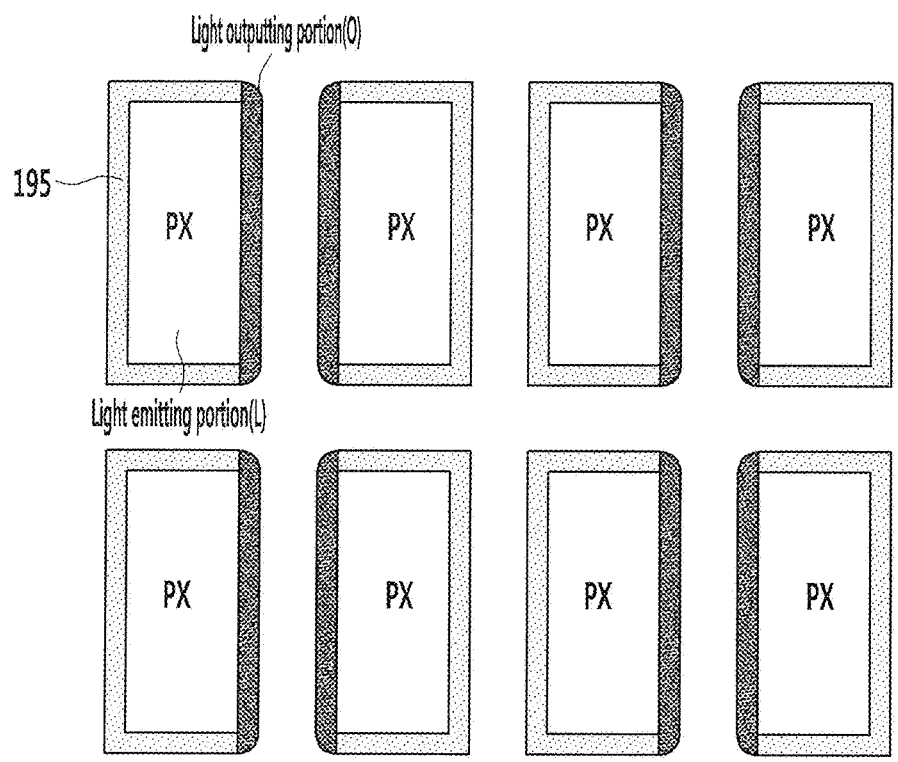

Referring to FIG. 20, locations of light outputting portions O of pixels PX arranged along the same column are equivalent to each other (that is, are located at the same location in each respective pixel PX), but locations of light outputting portions O of pixels PX arranged along different columns may be different from each other (that is, light outputting portions O may be at different locations in each respective pixel PX). For example, locations of light outputting portions O of pixels PX arranged along adjacent columns may be opposite to each other. Accordingly, locations of light outputting portions O of pixels PX arranged along one row may alternate in each column. However, the present embodiment is not limited thereto, and locations of light outputting portions O of pixels PX arranged along one row may alternate in every two or more columns.

Figure 21:
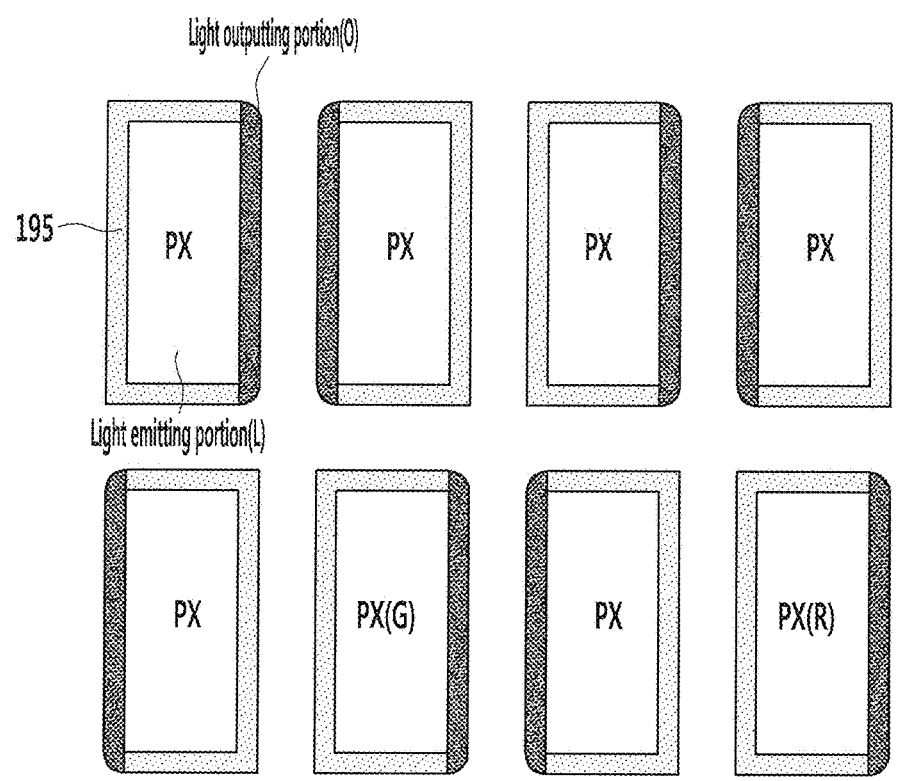

Referring to FIG. 21, locations of light outputting portions O of pixels PX adjacent to each other along both a row direction and a column direction may be different from each other. That is, locations of light outputting portions O of pixels PX arranged along one row alternate in each column, and at the same time, locations of light outputting portions O of pixels PX arranged along one column may alternate in each row. However, the present embodiment is not limited thereto, and locations of light outputting portions O of pixels PX arranged along one row may alternate in every two or more columns. Also, locations of light outputting portions O of pixels PX arranged along one column may alternate in every two or more rows.

Next, referring to FIG. 22 to FIG. 25, when a pixel PX according to an example embodiment of the present invention is substantially formed in the shape of a quadrangle, a light outputting portion O may be formed corresponding to at least two sides of the quadrangle.

Figure 22:
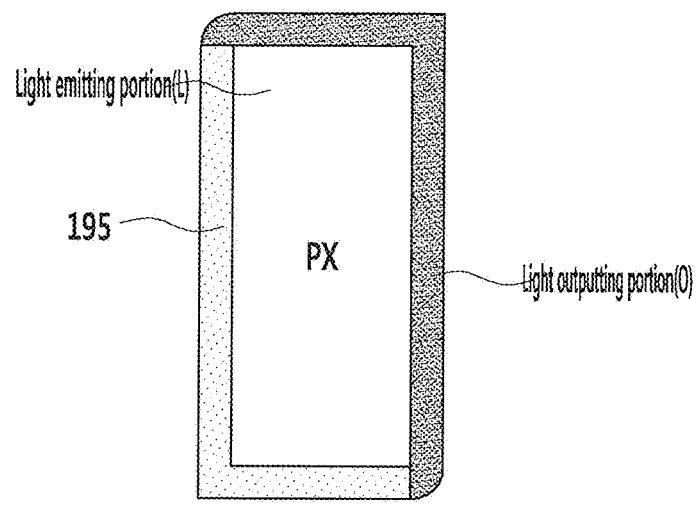
FIG. 22 to FIG. 25 are schematic top plan views of one pixel of the OLED display according to the example embodiment of the present invention.

FIG. 22 illustrates an example embodiment in which a light outputting portion O is formed corresponding to two adjacent sides of the pixel PX, for example, the right side and the top side of the pixel PX. In this case, a reflective portion 195 may be formed corresponding to the other two sides of the pixel PX, that is, the left side and the bottom side.

Figure 23:
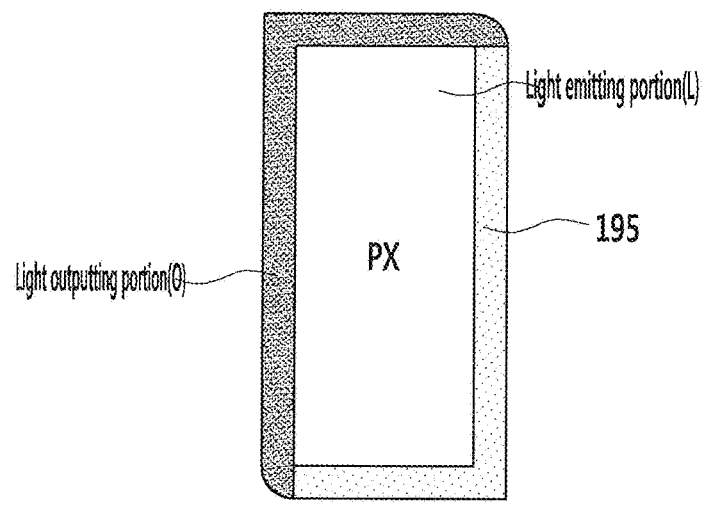

FIG. 23 illustrates an exemplary embodiment in which a light outputting portion O is formed corresponding to two adjacent sides of the pixel PX, for example, the left side and the top side. In this case, a reflective portion 195 may be formed corresponding to the other two sides of the pixel PX, that is, the right side and the bottom side.

Figure 24:
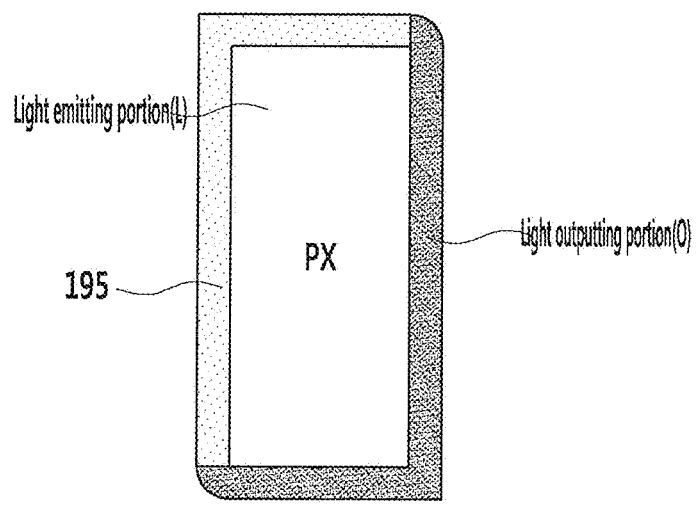

FIG. 24 illustrates an example embodiment in which a light outputting portion O is formed corresponding to the right side and the bottom side of the pixel PX, and a reflective portion 195 is formed corresponding to the left side and the top side of the pixel PX.

Figure 25:
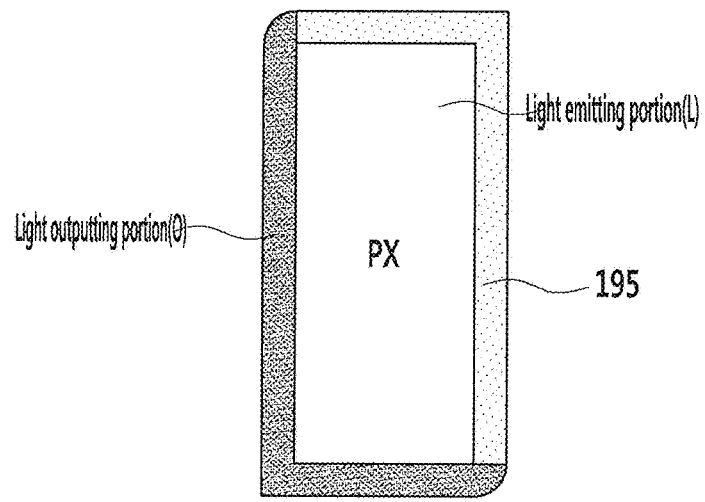

FIG. 25 illustrates an example embodiment in which a light outputting portion O is formed corresponding to the left side and the bottom side of the pixel PX, and a reflective portion 195 is formed corresponding to the right side and the top side of the pixel PX.

Locations of light outputting portions O of a plurality of pixels PX may be variously arranged as necessary or desired.

Figure 26:
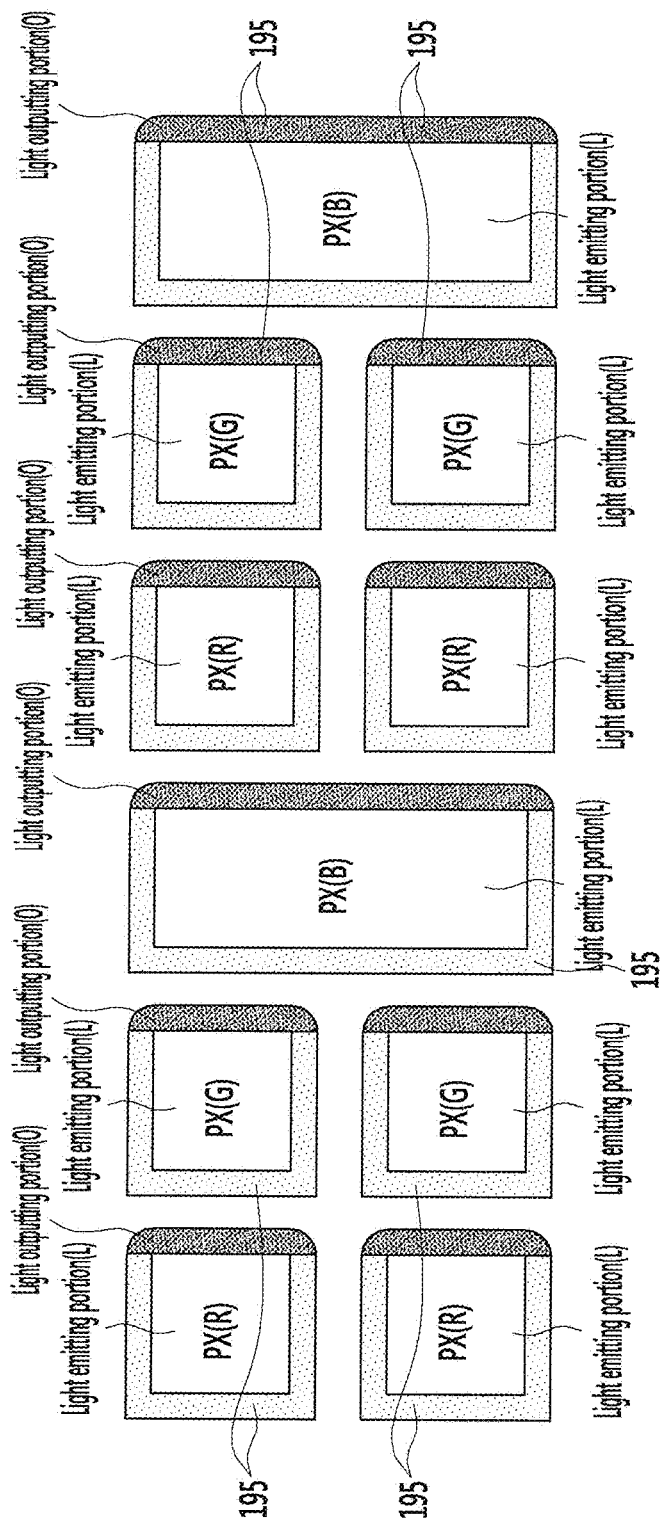
FIG. 26 to FIG. 30 are layout views of the OLED display according to the example embodiment of the present invention.
Figure 27:
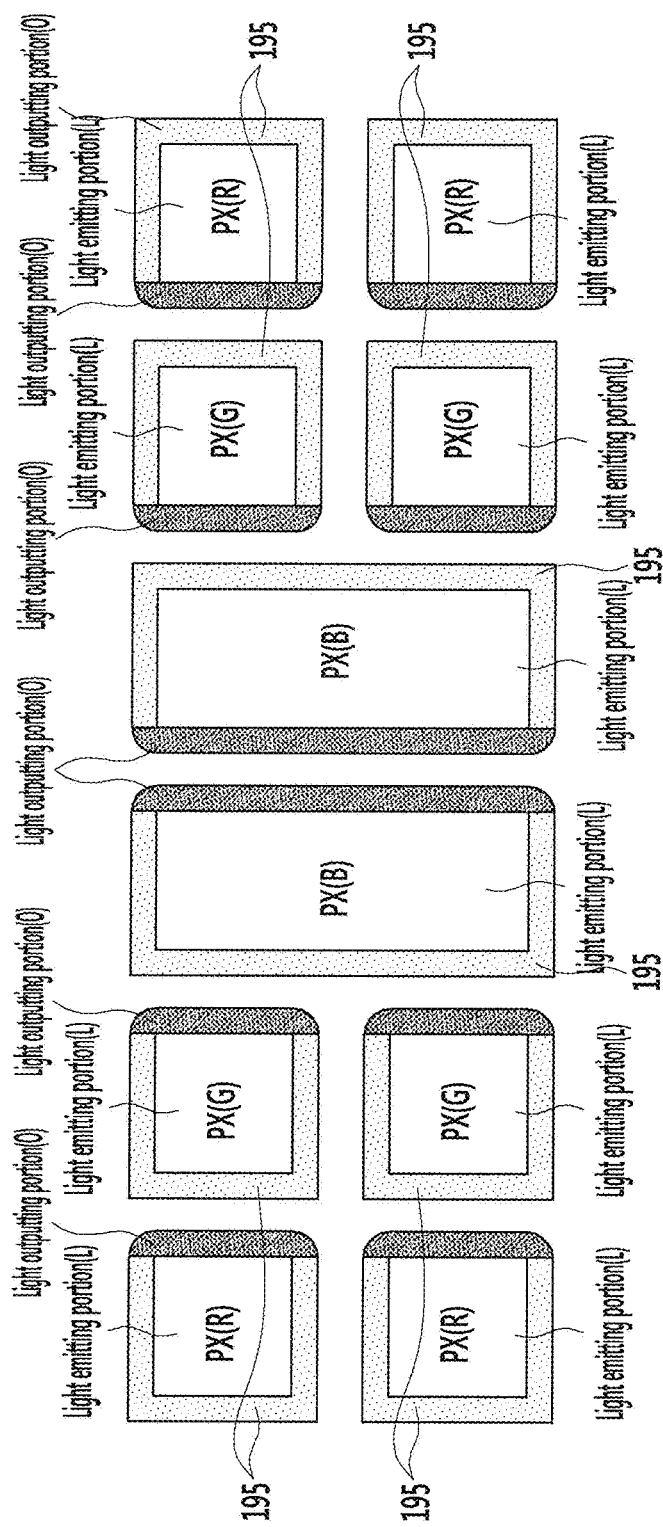

Referring to FIG. 26 and FIG. 27, an OLED display according to an example embodiment of the present invention may have pixels PX representing different primary colors, and the pixels PX may have sizes different from each other. For example, a pixel PX of a red color R (PX(R)) and a pixel PX of a green color G (PX(G)) have substantially the same size, and a pixel PX of a blue color B (PX(B)) may be larger than the pixel PX of the red color R and the pixel PX of the green color G. The size of the pixel PX of the blue color B may be about two times the size of (that is, twice as large as) each of the pixel PX of the red color R and the pixel PX of the green color G. However, the present embodiment is not limited thereto, and the size of the pixel PX of the green color G or the red color R may be greater than the size of a pixel PX that represents the other primary color.

Referring to FIG. 26, locations of light outputting portions O of all the pixels PX may be consistent (that is, the location of the light outputting portions O may be the same on each of the respective pixels PX).

Referring to FIG. 27, locations of light outputting portions O of pixels PX representing at least one primary color among a plurality of primary colors may be inconsistent (e.g., may vary). FIG. 27 illustrates an example embodiment in which a location of a light outputting portion O of a pixel PX of a blue color B (PX(B)), which is the largest pixel by size, is inconsistent or varies. That is, locations of light outputting portions O of pixels PX of the blue color B may alternate along a row or column direction.

Referring to FIG. 28 to FIG. 31, an OLED display according to example embodiments of the present invention may include a plurality of pixels PX arranged substantially in a matrix form while being slightly inclined with respect to a horizontal or vertical direction. In this case, the horizontal or vertical direction may be a direction in which a plurality of signal lines supplying a signal to a thin film transistor of each pixel PX extend. In the present example embodiment, a first direction DR1 extending in a right to top direction (that is, extending in an upper right direction of the figures) is called a row direction, and a second direction DR2 extending in a right to bottom direction (that is, extending in a lower right direction of the figures) is called a column direction.

The plurality of pixels PX may substantially have the same shape, and for example, each may be formed in the shape of a rhombus.

A pixel PX of a red color R (PX(R)) and a pixel PX of a green color G (PX(G)) are alternately arranged along each row or each column, and a pixel PX of a blue color B (PX(B)) and a pixel PX of a green color G (PX(G)) are alternately arranged along an adjacent row or column. In this case, the pixel PX of the red color R and the pixel PX of the blue color B are adjacent to each other along a diagonal direction (that is, a diagonal direction in relation to the first direction DR1 or the second direction DR2) rather than being directly adjacent to each other along adjacent rows or adjacent columns. That is, the pixel PX of the red color R and the pixel PX of the blue color B may be adjacent to the pixel PX of the green color G in an adjacent row or adjacent column.

Figure 28:
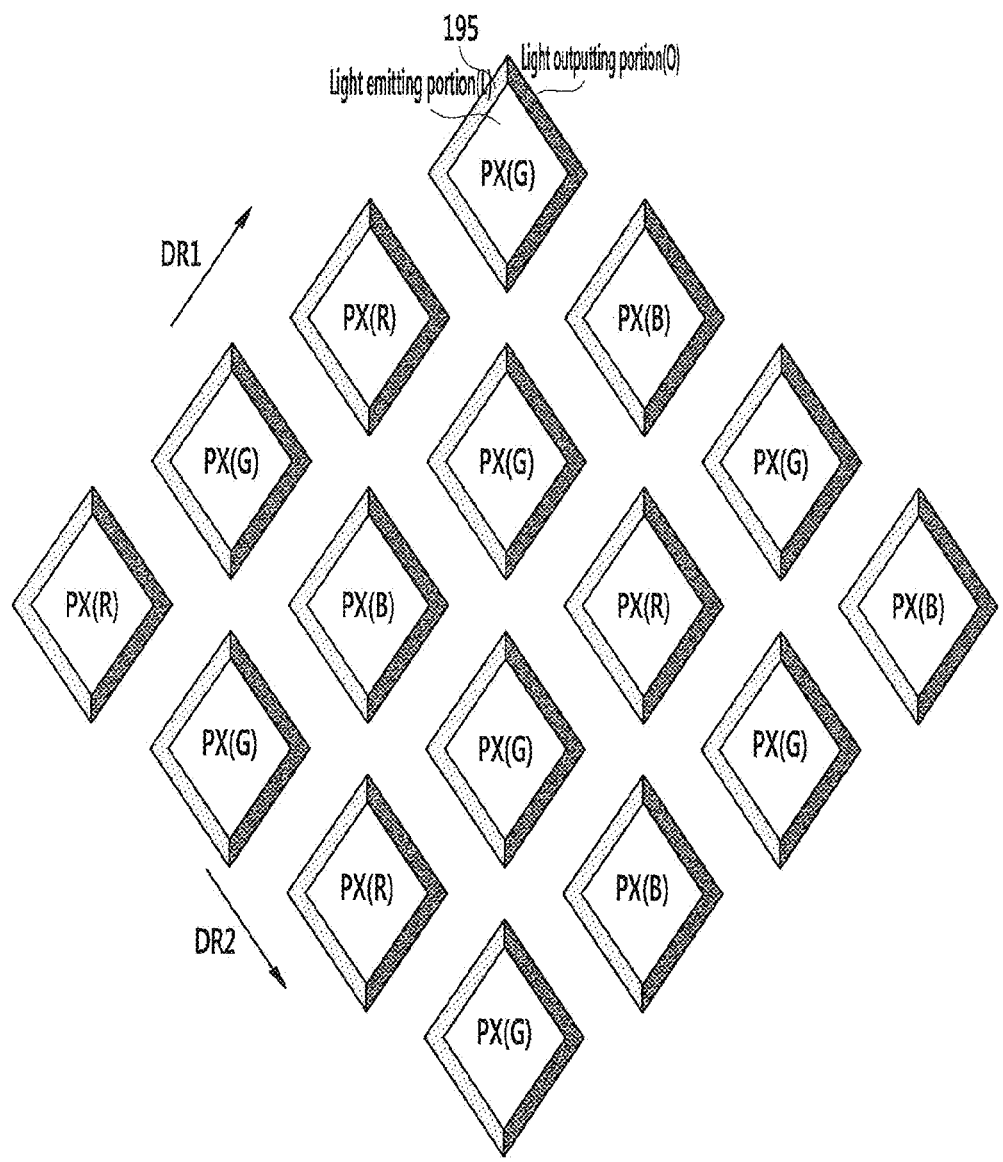

According to an example embodiment of the present invention, a light outputting portion O may be formed in an area that corresponds to at least one side among a plurality of sides of each pixel PX. FIG. 28 to FIG. 30 illustrate example embodiments in which light outputting portions O are formed corresponding to two sides of each pixel PX, for example, an upper right side and a lower right side or an upper left side and a lower left side among four sides of each of the respective pixels PX.

Referring to FIG. 28, locations of the light outputting portions O of all the pixels PX may be consistent.

Referring to FIG. 29, a location of light outputting portions O of a pixel PX representing at least one primary color may be different from locations of light outputting portions O of pixels PX representing the remaining primary colors. For example, as shown in FIG. 29, locations of light outputting portions O of pixels PX of a red color R and a blue color R are equivalent to or the same as each other, and a location of light outputting portions O of a pixel PX of a green color G may be different from locations of light outputting portions O of pixels PX representing the other primary colors. Thus, locations of light outputting portions O of pixels PX arranged along the vertical direction rather than a row or column direction may be consistent, and locations of light outputting portions O of pixels PX directly adjacent along a diagonal direction may be opposite to each other.

Referring to FIG. 30, locations of light outputting portions O of pixels PX arranged along the vertical direction, rather than the row or column direction, may alternate in each pixel PX.

Referring to FIG. 31, the present example embodiment is substantially similar to the example embodiments shown in FIG. 28 to FIG. 30, except that a light outputting portion O may be formed corresponding to one side among four sides of each pixel PX. In the present example embodiment, when locations of light outputting portions O of different pixels PX are changed or varied, a location of a light outputting portion O corresponding to one side of the pixel PX may be variously changed, for example, among the other sides of the pixel PX.

Referring to FIG. 32, a pixel PX of a red color R and a pixel PX of a blue color B have substantially the same or the same shape, and the shape of a pixel PX of a green color G may be different from that of the pixels PX of the other primary colors.

The pixels PX of the red color R and the blue color B may be larger than the pixel PX of the green pixel G and may be different in shape. The pixel PX of the red color R and the pixel PX of the blue color B may be a regular polygon, for example, an octagon, respectively, and the pixel PX of the green G may be a polygon, for example, a quadrangle. The pixel PX of the red color R and the pixel PX of the blue color B are alternately arranged along row and column directions, and the pixel PX of the green color G may be provided between adjacent pixels PX of a red color R and a blue color B along a diagonal direction. Accordingly, each of the pixels PX of the green color G may be surrounded by four pixels PX of the red color R and pixels PX of the blue color B (that is, each of the pixels PX of the green color G may be directly adjacent to two pixels PX of the red color R and two pixels PX of the blue color B).

Referring to FIG. 32, light outputting portions O of the pixel PX of the red color R and the pixel PX of the blue color B may be formed corresponding to the three right sides of the pixels PX, and a light outputting portion O of the pixel PX of the green color G may be formed corresponding to the two right sides of the pixel PX. However, the locations of the light outputting portions O are not limited thereto. Locations of sides and the number of sides at which a light outputting portion O corresponds may be variously changed, and locations of the light outputting portions O may be regularly or irregularly changed or varied with respect to all the pixels PX.

Now, a refractive index of an insulating layer 350 included in a reflective portion of an OLED display according to an example embodiment of the present invention will be described with reference to FIG. 33 to FIG. 36, together with the above-described drawings.

FIG. 33 to FIG. 36 illustrate simulation results that show a degree of light leakage according to various refractive indexes of the insulating layer 350 of the OLED display according to the example embodiment of the present invention.

As previously described, the insulating layer 350 is provided at an upper or lower portion of a reflective portion 195 for insulation between the reflective portion 195 and an opposing electrode 270 or a pixel electrode 191. A part of the insulating layer 350 may contact an emission layer 370, and therefore some light generated in the emission layer 370 may be incident to the insulating layer 350. In this case, a refractive index of the insulating layer 350 may be lower than that of the emission layer 370 to more effectively reflect light at a boundary between the emission layer 370 and the insulating layer 350.

Referring to FIG. 33 to FIG. 36, when the refractive index of the insulating layer 350 is less than or equal to about 1.4, light leakage at a side is maintained low, and when the refractive index of the insulating layer 350 is greater than about 1.4, the light leakage at the side gradually increases. Here, the light leakage denotes a ratio of the amount of light leaked at the side through the insulating layer 350 with respect to light moving toward the insulating layer 350.

Therefore, the refractive index of the insulating layer 350 should be less than or equal to about 1.4 so as to effectively block most of light leakage at the side.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

Description of Reference Symbols

50: photoresist pattern
110: insulation substrate
120, 180, 350: insulating layer
191: pixel electrode
195: reflective portion
220: light blocking member
270: opposing electrode
360: pixel defining layer
370: emission layer
380: spacer
L: light emitting portion
O: light outputting portion
SW: side wall

What is claimed is:

1. An organic light emitting diode (OLED) display comprising a plurality of pixels, wherein at least one of the pixels comprises:
    a light emitting portion comprising:
        an emission layer configured to generate light,
        a pixel electrode, and
        an opposing electrode facing the pixel electrode, the emission layer being between the pixel electrode and the opposing electrode in a first direction and forming the light emitting portion, and
    a light outputting portion at a side of the light emitting portion in a second direction crossing the first direction and configured to allow more of the light to be outputted therefrom than is outputted from the light emitting portion.

2. The OLED display of claim 1, wherein the pixel further comprises a reflective portion facing the light outputting portion at another side of the light emitting portion opposite to the light outputting portion with the light emitting portion between the reflective portion and the light outputting portion.

3. The OLED display of claim 2, wherein the reflective portion, the pixel electrode, and the opposing electrode are configured to reflect light toward the emission layer.

4. The OLED display of claim 3, wherein at least one of the reflective portion, the pixel electrode, and the opposing electrode comprises a reflective conductive material.

5. The OLED display of claim 3, wherein the light outputting portion and the reflective portion surround the light emitting portion.

6. The OLED display of claim 5, wherein the pixel has a plurality of edge sides extending along a periphery of the respective pixel, and
    the light outputting portion corresponds to at least one of the edge sides, and the reflective portion corresponds to the remaining edge sides.

7. The OLED display of claim 3, wherein a portion of the opposing electrode is in the light outputting portion, and
    the portion of the opposing electrode in the light outputting portion comprises an inclined portion inclined with respect to a direction in which another portion of the opposing electrode in the light emitting portion extends.

8. The OLED display of claim 7, wherein the pixel further comprises a pixel defining layer between the pixel electrode and the opposing electrode, and
    wherein the pixel defining layer comprises a side wall facing the inclined portion and has an opening corresponding to the pixel electrode.

9. The OLED display of claim 3, wherein each of the plurality of pixels respectively comprises the light emitting portion, the light outputting portion, and the reflective portion, and
    the light outputting portion is located at a same side of each respective pixel.

10. An organic light emitting diode OLED display comprising a plurality of pixels, wherein at least one of the pixels comprises:
    a light emitting portion comprising:
        an emission layer configured to generate light,
        a pixel electrode, and
        an opposing electrode facing the pixel electrode, the light emitting portion being between the pixel electrode and the opposing electrode,
    a light outputting portion at a side of the light emitting portion and configured to allow the light to pass therethrough, and
    a reflective portion facing the light outputting portion at another side of the light emitting portion opposite to the light outputting portion with the light emitting portion between the reflective portion and the light outputting portion,
    wherein at least one of the reflective portion, the pixel electrode, and the opposing electrode is configured to reflect light toward the emission layer,
    wherein at least one of the reflective portion, the pixel electrode, and the opposing electrode comprises a reflective conductive material, and
    wherein the pixel further comprises an insulating layer directly above or directly below the reflective portion.

11. The OLED display of claim 10, wherein the insulating layer has a refractive index of less than or equal to about 1.4.

12. The OLED display of claim 11, wherein the reflective portion is at a same layer as the pixel electrode and comprises a same material as that of the pixel electrode, and a thickness of the reflective portion is greater than that of the pixel electrode.

13. The OLED display of claim 12, wherein a step difference between a top surface of the reflective portion and a top surface of the pixel electrode is in a range of about 0.1 μm to about 1 μm.

14. The OLED display of claim 13, wherein the insulating layer is between the reflective portion and the opposing electrode.

15. The OLED display of claim 11, wherein the reflective portion is at a layer different from a layer at which the pixel electrode is located, and the insulating layer is between the pixel electrode and the reflective portion.

16. The OLED display of claim 15, wherein a thickness of the reflective portion is in a range of about 0.1 μm to about 1 μm.

17. The OLED display of claim 16, wherein the reflective portion contacts the opposing electrode.

18. An organic light emitting diode OLED display comprising at least two pixels, wherein each of the pixels respectively comprises:

a light emitting portion comprising:
   an emission layer configured to generate light,
   a pixel electrode, and
   an opposing electrode facing the pixel electrode, the light emitting portion being between the pixel electrode and the opposing electrode,
a light outputting portion at a side of the light emitting portion and configured to allow the light to pass therethrough, and
a reflective portion facing the light outputting portion at another side of the light emitting portion opposite to the light outputting portion with the light emitting portion between the reflective portion and the light outputting portion,
wherein at least one of the reflective portion, the pixel electrode, and the opposing electrode is configured to reflect light toward the emission layer, and
wherein locations of the light outputting portions with respect to the light emitting portions in the at least two pixels are different from each other.

19. The OLED display of claim 18, wherein the at least two pixels are arranged substantially in a matrix form, and
the locations of the light outputting portions with respect to the light emitting portions of the pixels arranged along a first direction are alternately changed for every at least one pixel along the first direction.

20. The OLED display of claim 19, wherein the locations of the light outputting portions with respect to the light emitting portions of the pixels arranged along a second direction that is different from the first direction are alternately changed for every at least one pixel.

* * * * *